United States Patent
Ito et al.

(10) Patent No.: US 8,669,134 B2
(45) Date of Patent: Mar. 11, 2014

(54) METHOD OF MANUFACTURING SOLID-STATE IMAGING DEVICE, SOLID-STATE IMAGING DEVICE, AND ELECTRONIC APPARATUS

(75) Inventors: Tomomi Ito, Kanagawa (JP); Ryoji Suzuki, Kanagawa (JP); Taichi Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 177 days.

(21) Appl. No.: 13/238,013

(22) Filed: Sep. 21, 2011

(65) Prior Publication Data

US 2012/0075509 A1 Mar. 29, 2012

(30) Foreign Application Priority Data

Sep. 28, 2010 (JP) ................................. 2010-217861

(51) Int. Cl.
*H01L 21/00* (2006.01)

(52) U.S. Cl.
USPC ... 438/70; 257/294; 257/E31.127; 257/E27.15; 348/272; 348/294

(58) Field of Classification Search
USPC ............ 257/294, 432, E31.127, E27.15; 438/70; 348/272, 294
See application file for complete search history.

(56) References Cited

U.S. PATENT DOCUMENTS

| | | | | |
|---|---|---|---|---|
| 5,889,277 | A * | 3/1999 | Hawkins et al. | 250/208.1 |
| 6,111,247 | A * | 8/2000 | Sengupta | 250/226 |
| 7,786,426 | B2 * | 8/2010 | Yamashita et al. | 250/226 |
| 7,799,491 | B2 * | 9/2010 | Holscher, Jr. | 430/7 |
| 2006/0158547 | A1 | 7/2006 | Komatsu et al. | |

FOREIGN PATENT DOCUMENTS

| | | |
|---|---|---|
| JP | 2006-128433 | 5/2006 |
| JP | 2006-295125 | 10/2006 |

\* cited by examiner

*Primary Examiner* — David Vu
(74) *Attorney, Agent, or Firm* — Dentons US LLP

(57) ABSTRACT

Provided is a method of manufacturing a solid-state imaging device including: forming a first pattern having an independent island shape configured by an optical filter material on some of photoelectric conversion units among a plurality of photoelectric conversion units arranged on the surface of a substrate; forming a mixed color prevention layer on a side wall of the first pattern; and forming a second pattern having an independent island shape configured by an optical filter material on the rest of the photoelectric conversion units among the plurality of photoelectric conversion units while the mixed color prevention layer is closely disposed between the first pattern and the second pattern.

9 Claims, 15 Drawing Sheets

METHOD OF MANUFACTURING SOLID-STATE IMAGING DEVICE, SOLID-STATE IMAGING DEVICE, AND ELECTRONIC APPARATUS

BACKGROUND

The present disclosure relates to a method of manufacturing a solid-state imaging device, a solid-state imaging device, and an electronic apparatus and more particularly, to a method of manufacturing a solid-state imaging device including a pattern of an optical filter for each pixel, a solid-state imaging device manufactured by the method, and an electronic apparatus.

In a solid-state imaging device including an optical filter of each of red, green, and blue disposed above a photoelectric conversion unit, an on-chip lens is disposed on the color optical filter, in order to improve light concentration with respect to a light receiving surface to be fine. In the solid-state imaging device of the configuration, the light input obliquely to the optical filter for each color from the on-chip lens is input to an adjacent photoelectric conversion unit, such that a mixed color is generated.

Therefore, a configuration, in which color filters of each color are separated from each other by a space and a gas or a material having a low refractive index is filled in the space, and a light reflective layer is disposed at a side wall of a partition separating the optical filter, is proposed. According to the configuration, light obliquely input to the optical filter is reflected in the space of the optical filter or an interface of the partition and is input to the photoelectric conversion unit which is disposed at the lower portion of a target optical filter, such that the mixed color is prevented.

As a method of manufacturing the solid-state imaging device of the configuration, two manufacturing methods are proposed. The first manufacturing method includes patterning an optical filter for each color on a substrate where photoelectric conversion units are arranged, forming a groove shape of pattern in a space between the optical filters for each color, and filling a low refractive index material in the space (the groove shape of pattern) if necessary (see Japanese Unexamined Patent Application Publication No. 2006-295125). The second manufacturing method includes forming a partition on the substrate where photoelectric conversion units are arranged and positioning an optical filter for each color in each area separated by the partition (see Japanese Unexamined Patent Application Publication No. 2006-128433).

SUMMARY

However, in the first manufacturing method, when the groove pattern is formed among the previously patterned optical filters, an alignment difference of the mask occurs. As a result, the groove-shaped pattern having a width considering the alignment difference should be formed. Further, in the second manufacturing method, an independent partition should be formed so as to have a width including the partition.

Accordingly, in the first and the second manufacturing methods, since the width capable of including the space and the partition is necessary, an exclusive area of the optical filter is smaller and as a result, a light amount input to the photoelectric conversion unit through the optical filter, that is, a light receiving amount is limited.

Therefore, it is desirable to provide a method of manufacturing a solid-state imaging device including a mixed color prevention layer among color optical filters disposed above the photoelectric conversion unit and improving the light receiving amount of the photoelectric conversion unit by enlarging the exclusive area of the optical filter. Further, it is desirable to provide a solid-state imaging device manufactured by the manufacturing method and an electronic apparatus including the solid-state imaging device.

The method of manufacturing a solid-state imaging device according to an embodiment of the present disclosure performs the following processes in sequence. First, a first pattern having an independent island shape made of an optical filter material is formed on some photoelectric conversion units among a plurality of photoelectric conversion units arranged on the surface of a substrate. Next, a mixed color prevention layer is formed on a side wall of the first pattern. Thereafter, a second pattern having an independent island shape made of an optical filter material is formed on the rest of the photoelectric conversion units among the plurality of photoelectric conversion units while the mixed color prevention layer is closely disposed between the first pattern and the second pattern.

According to the order, the mixed color prevention layer disposed closely between the first pattern and the second pattern having the island shape is self-alignedly formed at the side wall of the first pattern. As such, in the formation of the mixed color prevention layer disposed between the first pattern and the second pattern, an alignment difference (margin) is not considered, such that a thickness of the mixed color prevention layer may be set as a minimum thickness. Accordingly, the mixed color prevention layer is disposed between the first pattern and the second pattern and the exclusive area of the optical filter can be maximally enlarged.

Further, the embodiment of the present disclosure provides a solid-state imaging device manufactured by the manufacturing method and an electronic apparatus including the solid-state imaging device, such that the mixed color prevention layer is disposed between the first pattern and the second pattern and the exclusive area of the optical filter can be maximally enlarged.

According to the embodiment of the present disclosure, in the solid-state imaging device including the mixed color prevention layer between the optical filters, the mixed color prevention layer is self-alignedly formed at the side wall of the optical filter. Therefore, the mixed color between the optical filters is prevented and the exclusive area of the optical filter is enlarged, such that the light receiving amount of the photoelectric conversion unit can be improved.

DETAILED DESCRIPTION OF EMBODIMENTS

Figure 1:
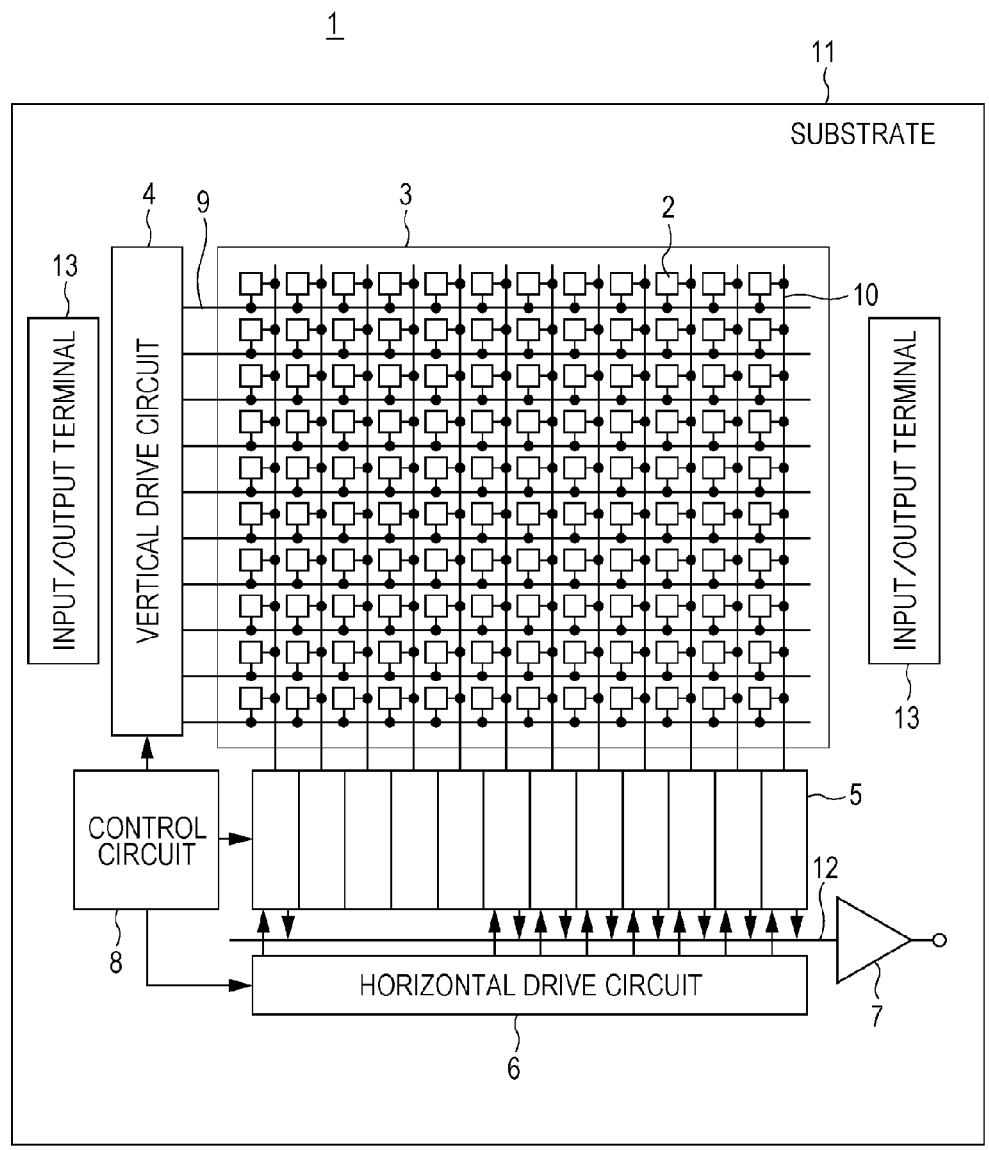
FIG. 1 is a schematic configuration diagram of an MOS type of solid-state imaging device applied to the present disclosure.

Hereinafter, best modes (hereinafter, referred to as "exemplary embodiments") of the present disclosure will be described. In addition, a description will be performed in the order described below.

1. Schematic configuration example of solid-state imaging device
2. First exemplary embodiment
   Method of manufacturing solid-state imaging device having W checkered alignment (1) and configuration
3. Second exemplary embodiment
   Method of manufacturing solid-state imaging device having W checkered alignment (2) and configuration
4. Third exemplary embodiment
   Method of manufacturing solid-state imaging device having W checkered alignment (3) and configuration
5. Fourth exemplary embodiment
   Method of manufacturing solid-state imaging device having W checkered alignment (4) and configuration
6. Fifth exemplary embodiment
   Method of manufacturing solid-state imaging device having bayer alignment (1) and configuration
7. Sixth exemplary embodiment
   Method of manufacturing solid-state imaging device having bayer alignment (2) and configuration
8. Seventh exemplary embodiment
   Configuration example of electronic apparatus In addition, in the exemplary embodiments, like reference numerals refer to like elements.

1. Schematic Configuration Example of Solid-State Imaging Device

FIG. 1 shows a schematic configuration of an MOS type solid image pick up apparatus, as an example of a solid image pick up apparatus manufactured by using a manufacturing method of each exemplary embodiment of the present disclosure.

As shown in FIG. 1, the solid-state imaging device 1 includes a pixel area (referred to as an image pickup area) 3 where a plurality of pixels 2 including photoelectric conversion units are regularly arranged at one surface of a substrate 11 made of single crystal silicon in a 2-dimension and a peripheral circuit unit thereof.

The pixel 2 is formed, for example, by a photoelectric conversion unit made of a photodiode and a plurality of pixel transistors (referred to as an MOS transistor).

The plurality of pixel transistors in each pixel 2 may be configured, for example, by three transistors such as a transmission transistor, a reset transistor, an amplification transistor. In addition, the plurality of pixel transistors may be configured by four transistors by adding a selection transistor to the three transistors. Since an equivalent circuit of a unit pixel is the same as a general circuit, the detailed description is omitted.

The pixel 2 may be configured by one unit pixel. In addition, the pixel 2 may have a sharing pixel structure. The pixel sharing structure is configured by a plurality of photodiodes, a plurality of transmission transistors, a sharing floating diffusion, and a sharing other pixel transistor. That is, in the sharing pixel, the photodiodes and the transmission transistors configuring a plurality of unit pixel are configured to share pixel transistor each other.

In addition, in the present disclosure, in each pixel 2, a in-layer lens or an on-chip lens to be described below is disposed above the photoelectric conversion unit, such that light concentration rate in each photoelectric conversion unit may be improved. In addition, an optical filter such as a transparent white filter or a color filter for each color is distributively disposed between the in-layer lens and the on-chip lens such that the light having a predetermined wavelength is selected and input.

The peripheral circuit unit includes a vertical driving circuit 4, a column signal processing circuit 5, a horizontal driving circuit 6, an output circuit 7, a control circuit 8, an input-output terminal 13, and the like.

The vertical driving circuit 4 is configured by, for example, a shift register and drives the pixel 2 by a row unit by selecting a pixel driving wire 9 and supplying a pulse for driving the pixel 2 to the selected pixel driving wire 9. That is, the vertical driving circuit 4 selectively scans each pixel 2 of the pixel area 3 by a row unit in a vertical direction in sequence and supplies the pixel signal based on a signal charge generated according to a light receiving amount for each pixel 2 to the signal processing circuit 5 through a vertical signal line 10.

The column signal processing circuit 5 is disposed, for example, for each column of the pixel 2 and performs a signal processing such as a noise removal for each pixel column with respect to a signal output from the pixel 2 of a first row. That is, the column signal processing circuit 5 performs the signal processing such as a correlated double sampling (CDS) for removing a unique fixed pattern noise of the pixel 2, a signal amplification, an analog/digital conversion (AD), or the like. A horizontal selection switch (not shown) is installed at an output terminal of the column signal processing circuit 5 by being connected with a horizontal signal line 12.

The horizontal driving circuit 6 is configured by, for example, a shift register and selects each column signal processing circuit 5 in sequence by outputting a horizontal scanning pulse in sequence to output the pixel signal to the horizontal signal line 12 from each column signal processing circuit 5.

The output circuit 7 performs the signal processing with respect to the signal supplied from each column signal processing circuit 5 through the horizontal signal line 12 in sequence to output the processed signal. For example, the signal processing may be performed by only a buffering and may be also performed by a black level adjustment, a column variation correction, various kinds of digital signal processes, and the like.

The control circuit 8 receives a data commanding an input clock and an operation mode, and the like or outputs a data such as inner information of the solid-state imaging device 1. That is, the control circuit 8 generates a clock signal or a control signal which is a reference of operations of the vertical driving circuit 4, the column signal processing circuit 5, and the horizontal driving circuit 6, based on a vertical synchronization signal, a horizontal synchronization signal, and a master clock. In addition, the signal is input to the vertical driving circuit 4, the column signal processing circuit 5, and the horizontal driving circuit 6.

The input output terminal 13 is connected to the output circuit 7 and the control circuit 8 to exchange the signal with the outside of the apparatus.

2. First Exemplary Embodiment

Method of Manufacturing a Solid-State Imaging Device Having a W Checkered Alignment (1)

Figure 2:
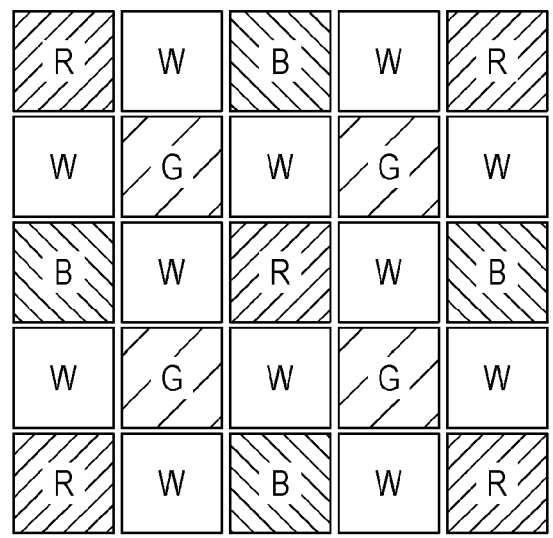
FIG. 2 is a plan view illustrating a W checkered arrangement of an optical filter applied to a first to fourth exemplary embodiment.

Before describing the manufacturing method of the first exemplary embodiment, in the solid-state imaging device having a W checkered alignment manufactured by the manufacturing method of the first exemplary embodiment, an alignment of an optical filter will be described. FIG. 2 is a plan view illustrating an alignment state of a W checkered alignment of an optical filter.

Hereinafter, the solid-state imaging device having a W checkered alignment manufactured by the manufacturing method of the first to the fourth exemplary embodiment uses an optical filter transmitting the light from a red area to a blue area, that is, a colorless transparent optical filter (hereinafter, referred to as a white filter W) as an optical filter on a photoelectric conversion unit. The white filter W is aligned in a checkered shape on each photoelectric conversion unit disposed in a row direction and in a column direction one by one among a plurality of photoelectric conversion units arranged on the surface of the substrate to be disposed as an independent island shape of pattern, respectively.

An optical filter transmitting the light of a green area (hereinafter, referred to as a green filter G) is disposed between the checkered aligned white filter W and the white filter W with double spacing. Further, between the rest of the white filter W and the white filter W, an optical filter transmitting the light of a red area (hereinafter, referred to as a red filter R) and an optical filter transmitting the light of a blue area (hereinafter, referred to as a blue filter B) are alternately disposed in a row direction. The green filter G, the red filter R, and the blue filter B each is aligned in the checkered shape between the white filters W, as the independent island shape of pattern.

In the solid-state imaging device having the optical filter alignment, particularly, the manufacturing method of the first exemplary embodiment is a first example of manufacturing a configuration including a mixed color prevention layer (not shown) between each of the optical filters W, G, R, and B and hereinafter, the manufacturing method will be described in sequence from the substrate.

Figure 3:
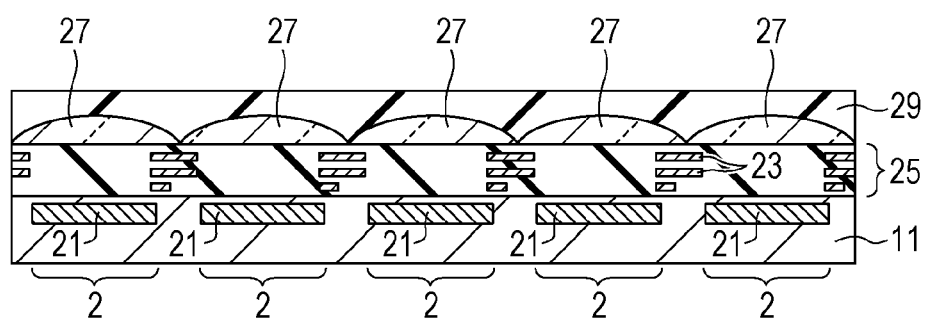
FIG. 3 is a cross-sectional configuration diagram of a cross section of a substrate in a first to a sixth exemplary embodiment.

First, as shown in FIG. 3, for example, a pixel 2 is set and aligned in a matrix direction on the surface of a substrate 11 made of a semiconductor material such as single crystal silicon and for example, a photoelectric conversion unit 21 configured by a photodiode is formed in each pixel 2. In addition, an impurities area of an element separation or charge accumulation unit (not shown) is formed. Next, a wire 23 such as a charge read electrode, a pixel driving wire, and a vertical signal line is formed at a position surrounding the photoelectric conversion unit 21 on the substrate 11. For example, the wire 23 is formed as a wire layer 25 of a multilayer wire structure by separating the multilayer wires 23 with an interlayer insulation film. Thereafter, an in-layer lens 27 corresponding to each photoelectric conversion unit 21 is formed on the wire layer 25 and a flat insulation film 29 is formed thereon. In general, each layer to the flat insulation film 29 disposed above the photoelectric conversion unit 21 may be made of, for example, a good optical transparency material in the overall of a demand wavelength area (visible light area).

The process described above is not particularly limited to the manufacturing order and may be performed by the same order as a general method of manufacturing the solid-state imaging device. A process to be described below is a distinguishing process of the first manufacturing method.

Figure 4A:
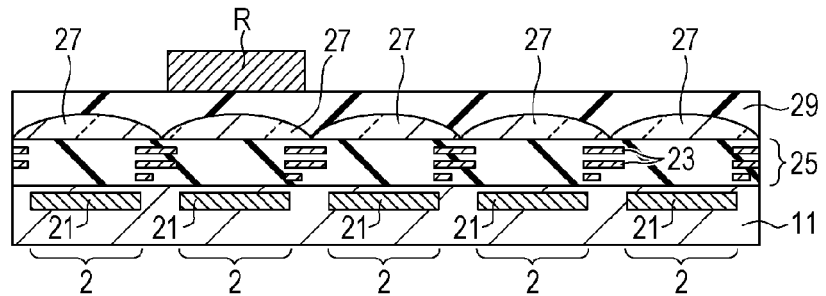
FIGS. 4A to 4D are cross section process diagrams (1) illustrating a manufacturing order of a first exemplary embodiment.

First, as shown in FIG. 4A, a red filter R is patterned on the flat insulation film 29. The red filter R is formed by using a photolithography process with a photoresist material containing, for example, a red pigment or a red dye. Each red filter R is patterned in an independent island shape by widely covering the upper portion of a target pixel 2 in the position described by using the plan view of FIG. 2.

Figure 4B:
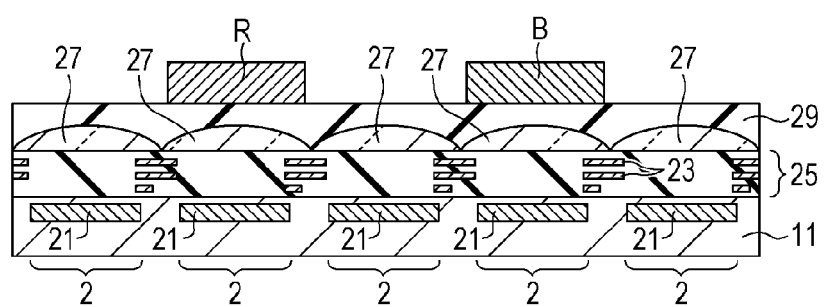

Next, as shown in FIG. 4B, a blue filter B is patterned on the flat insulation film 29. The blue filter B is formed by using a photolithography process with a photoresist material containing, for example, a blue pigment or a blue dye. Each blue filter B is patterned in an independent island shape by widely covering the upper portion of a target pixel 2 in the position described by using the plan view of FIG. 2.

Further, although not shown herein, the green filter G is continuously patterned on the flat insulation film 29. The green filter G is formed by using a photolithography process with a photoresist material containing, for example, a green pigment or a green dye. Each green filter G is patterned in an independent island shape by widely covering the upper portion of a target pixel 2 in the position described by using the plan view of FIG. 2.

As described above, on the flat insulation film 29, the red filter R, the blue filter B, and the green filter G having the independent island shape, respectively, are formed on the target pixel 2 as the first pattern in a checkered alignment. However, referring to FIG. 2, in viewing from the plan, four corners of the green filter G and four corners of the red filter R and the blue filter B may be joined to each other within the range of an alignment accuracy of the photolithography process in the formation of each of the color filters R, B, and G.

As described above, the order of forming each of the color filters R, B, and G is not particularly limited and each of the color filters R, B, and G is formed in a proper order depending on characteristics of the optical filter material used to form the color filters R, B, and G, and the like.

Figure 4C:
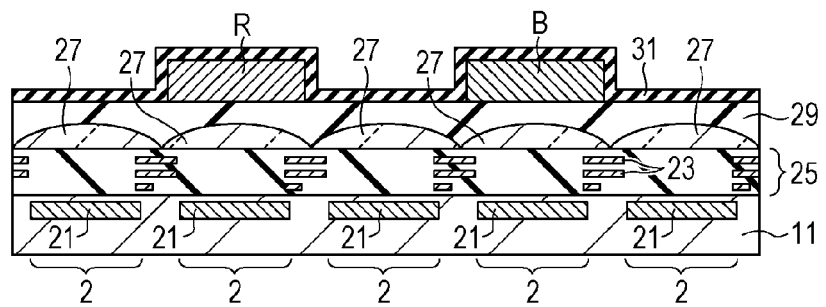

Next, as shown in FIG. 4C, a mixed color prevention layer 31 having a thickness thinner than the first pattern is formed on the flat insulation film 29 where each of the color filters R, B, and G (the green filter G is not shown) is formed as the first pattern with the color filters covered. Herein, the formed mixed color prevention layer 31 is made of a material having a refractive index lower than each of the color filters R, B, and G. If the material of the mixed color prevention layer 31 has a refractive index lower than each of the color filters R, B, and G, an inorganic insulation material such as silicon oxide, silicon nitride, silicon oxynitride, silicon carboxide, and the like is used. In addition, an organic insulation material or a conductive material may be used and all materials having high reflectance with respect to a light irradiation from each of the color filters R, B, and G may be used. For example, when the refractive index of each of the color filters R, B, and G is about 1.65, silicon oxide ($SiO_2$: refractive index 1.45) is used as the mixed color prevention layer.

The formation of the mixed color prevention layer 31 may be isotropically performed by a chemical vapor deposition (CVD) and the like at a low temperature capable of being formed at a less than heat-resistance temperature of the previously formed color filters R, B, and G. Accordingly, while the pattern shape of each of the color filters R, B, and G is maintained, the mixed color prevention layer 31 is formed with a thin film on the side wall of each of the color filters R, B, and G.

Figure 4D:
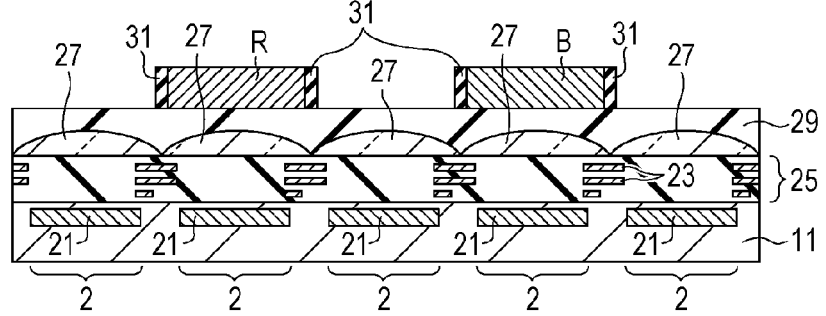

Next, as shown in FIG. 4D, the mixed color prevention layer 31 is left at only the side wall of each of the color filters R, B, and G by anisotropically etching the mixed color prevention layer 31 and the mixed color prevention layer 31 on each of the color filters R, B, and G and the flat insulation film 29 is removed.

Figure 5A:
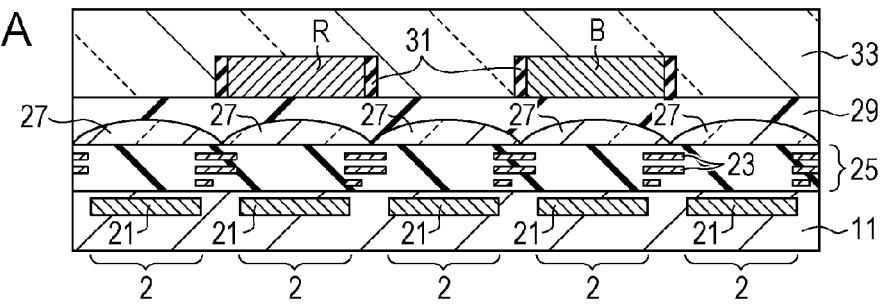
FIGS. 5A to 5D are cross section process diagrams (2) illustrating a manufacturing order of a first exemplary embodiment.

Thereafter, as shown in FIG. 5A, on the flat insulation film 29, a lens member 33 is film-formed with a sufficient thickness so as to embed the mixed color prevention layer 31 of each of the color filters R, B, and G and the side wall. The lens member 33 is made of a colorless transparent material transmitting the light from the red area to the blue area and is film-formed by, for example, an application. In particular, as described below, since the white filter W is configured to use the lens member 33 as the optical filter material, a material having a refractive index higher than the mixed color prevention layer 31 is used as the lens member 33. For example, when the mixed color prevention layer 31 is formed by silicon oxide ($SiO_2$: refractive index 1.45), an organic material having a refractive index of 1.6 is used as the lens member 33.

Figure 5B:
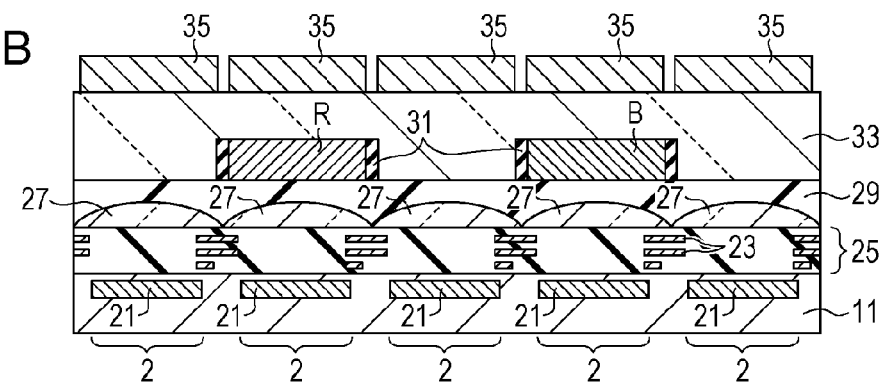

Next, as shown in FIG. 5B, on the lens member 33, a mask 35 made of a material having reflowability is patterned at the position corresponding to all the pixels 2.

Figure 5C:
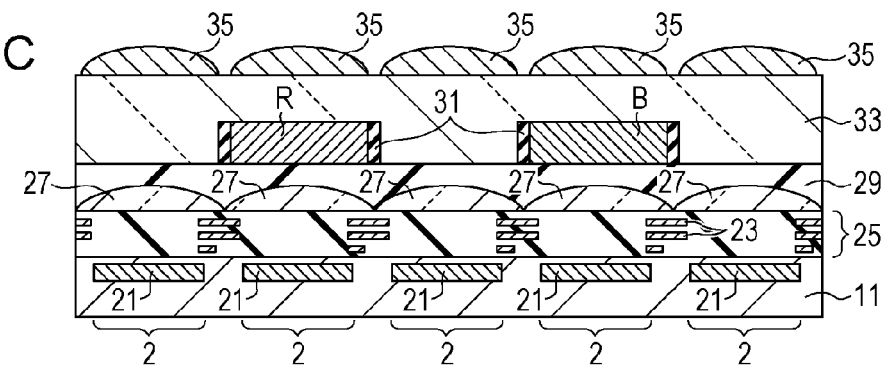

Thereafter, as shown in FIG. 5C, the mask 35 is reflowed by a heating to be formed in a lens shape.

Figure 5D:
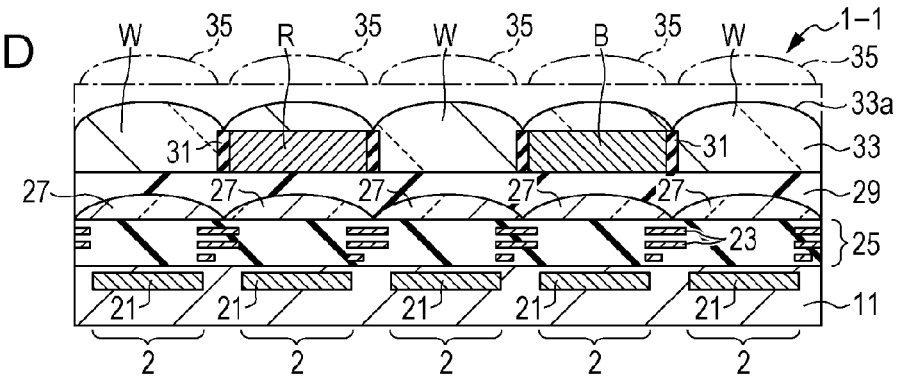

Next, as shown in FIG. 5D, on the mask 35 reflowed in the lens shape, surface layers of the mask 35 and the lens member 33 are etched and the lens shape of the reflowed mask 35 is transferred on the surface of the lens member 33. Accordingly, an on-chip lens 33a is formed by forming the lens member above the color filters R, B, and G. In addition, among the color filters R, B, and G, the white filter W where the lens member 33 is left by the thicknesses of the color filters R, B, and G and the on-chip lens 33a made of the lens member thereabove are integrally formed.

The white filter W is aligned in a checkered shape on the target pixel 2 as the second pattern having an independent island shape among the color filters R, B, and G aligned in the checkered shape. In addition, the mixed color prevention layer is closely disposed between each white filter W and the adjacent color filters R, B, and G. However, referring to FIG. 2, in viewing from the plan, four corners of each white filter W may be joined to each other within the range of an alignment accuracy of the photolithography process in the formation of each of the color filters R, B, and G.

As described above, the solid-state imaging device 1-1 of the first exemplary embodiment may be formed. In the formed solid-state imaging device 1-1, the color filters R, B, and G are aligned in a checkered shape as the first pattern having the independent island shape on the photoelectric conversion unit 21 of the surface of the substrate 11. Further, among the color filters R, B, and G, the white filter W is disposed as the second pattern having the independent island shape. In addition, between the white filter W and each of the color filters R, B, and G, the mixed color prevention layer 31 made of a material having a refractive index lower than the filters is closely disposed.

Figure 6:
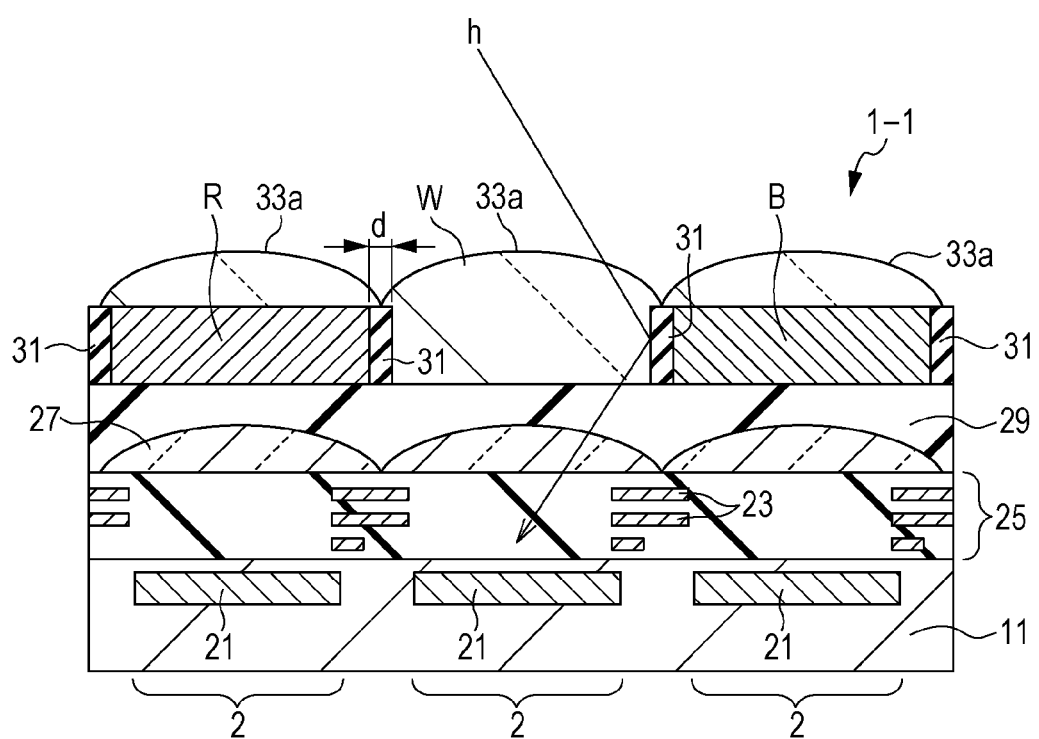
FIG. 6 is a cross-sectional view of a solid-state imaging device manufactured by the manufacturing order of the first exemplary embodiment.

FIG. 6 shows a cross-sectional configuration diagram enlarging main parts of the solid-state imaging device 1-1 formed by the first exemplary embodiment. As shown in FIG. 6, light h input to the solid-state imaging device 1-1 is concentrated by the on-chip lens 33a to be input to each of the color filters W, R, B, and G disposed below the on-chip lens 33a. Among the light, the light h concentrated by the on-chip lens 33a and input to the color filters W, R, B, and G from an inclined direction is reflected on the mixed color prevention layer 31 having a low refractive index which is closely disposed between the color filters W, R, B, and G. Accordingly, for example, the light h input from the inclined direction with respect to the white filter W is not input to the photoelectric conversion unit 21 disposed below the adjacent blue filter B.

Herein, for example, when a refractive index of the blue filter B is 1.65 and a refractive index of the white filter W is 1.6, a critical angle is 76 degrees. In this case, when the mixed color prevention layer 31 is not installed, the light input to the white filter W from the inclined direction is received to the blue filter B having a high refractive index and a light receiving output of a wavelength area which gets out of the blue area is detected from the pixel of the blue filter B, such that so-called "a mixed color" is generated. Accordingly, the solid-state imaging device 1-1 according to the first exemplary embodiment includes the mixed color prevention layer 31 having a refractive index lower than the white and blue color filters disposed between the white filter W and the blue filter B. For this reason, the light input to the white filter W in the inclined direction is reflected on the mixed color prevention layer 31 to have no light received to the blue filter B. Therefore, the light receiving output of a wavelength area which gets out of the blue area is not detected from the pixel of the blue filter B. Therefore, in the solid-state imaging device 1-1 having the configuration acquired by the first exemplary embodiment, the mixed color can be prevented and image quality can be improved.

In particular, in the manufacturing method of the first exemplary embodiment, first, the mixed color prevention layer 31 is self-alignedly formed at the side wall of each of the color filters R, B, and G formed as the first pattern having an island shape. Thereafter, the white filter W is formed as the second pattern with the mixed color prevention layer 31 disposed closely between the color filters R, B, and G. As a result, when the mixed color prevention layer 31 is formed, a margin of the alignment with the patterned color filters W, R, B, and G is not considered and a thickness d of the mixed color prevention layer 31 disposed at the side wall of the color filters R, B, and G may be set by a minimum thickness. Accordingly, according to the manufacturing method of the first exemplary embodiment, the solid-state imaging device can be acquired, in which the mixed color prevention layer is installed so as to improve the image quality and an appropriable area of the color filters W, R, B, and G is maximally enlarged so as to further improve the image quality.

3. Second Exemplary Embodiment

Method of Manufacturing a Solid-State Imaging Device Having a W Checkered Alignment (2)

The manufacturing method of the second exemplary embodiment is a second example of the method of manufacturing a solid-state imaging device in which an optical filter has a W checkered alignment as described in FIG. 2 like the first exemplary embodiment and hereinafter, the manufacturing method will be described in sequence from a substrate.

First, as described by using FIG. 3 with respect to the first exemplary embodiment, a photoelectric conversion unit 21, a wire layer 25 including a wire 23, an in-layer lens 27, and a flat insulation film 29 are formed on the surface of a substrate 11 in sequence. However, the uppermost layer of the flat insulation film 29 is formed so as to have a thickness sufficient to form a white filter by using the flat insulation film 29 as an optical filter material, for example, a photoresist material.

Figure 7A:
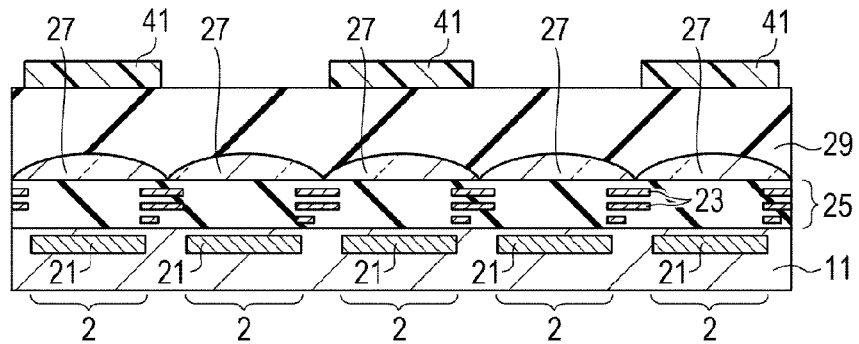
FIGS. 7A to 7D are cross section process diagrams (1) illustrating a manufacturing order of a second exemplary embodiment.

Next, as shown FIG. 7A, on the flat insulation film 29 having the sufficient thickness, the white filter forms an independent island shape of pattern 41 on the pixel 2 aligned in a checkered shape so as to widely cover the upper portion of the pixel 2. The pattern 41 is formed by a photolithography process by using the photoresist material.

Figure 7B:
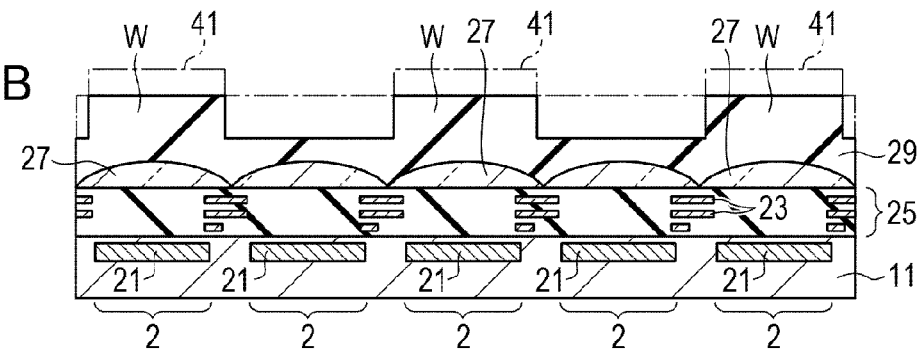

Thereafter, as shown in FIG. 7B, the shape of the pattern 41 is transferred on the surface of the flat insulation film 29 by etching the pattern 41 and the surface layer of the flat insulation film 29 on the pattern 41 to be formed in an uneven shape. As a result, the white filter W which thickly forms a part of the surface of the flat insulation film 29 is formed on a target pixel 2 with the pattern 41. The white filter W is formed on the target pixel 2 as the first pattern with a checkered alignment. However, referring to FIG. 2, in viewing from the plan, four corners of each white filter W may be joined to each other within the range of an alignment accuracy of the photolithography process in the formation of white filter W.

Figure 7C:
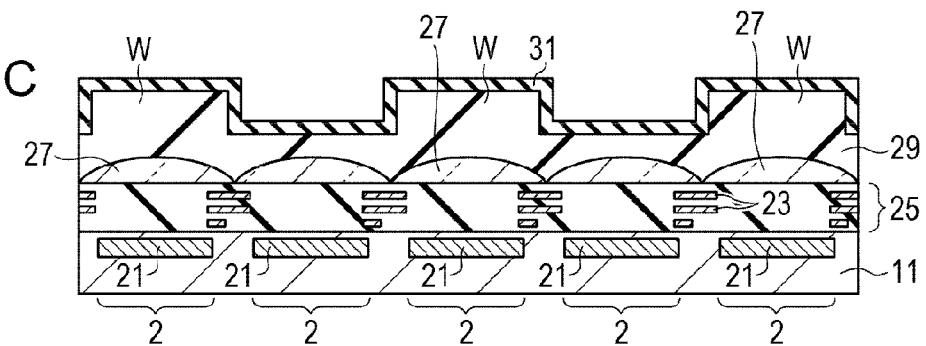

Next, as shown in FIG. 7C, a mixed color prevention layer 31 having a thickness thinner than the first pattern is formed on the flat insulation film 29 where the white filter W is formed as the first pattern with the white filter covered. Herein, the formed mixed color prevention layer 31 is made of a material having a refractive index lower than the white filter W. If the material of the mixed color prevention layer 31 has a refractive index lower than the white filter W, an inorganic insulation material such as silicon oxide, silicon nitride, silicon oxynitride, silicon carboxide, and the like is used. In addition, an organic insulation material or a conductive material may be used and all materials having high reflectance with respect to a light irradiation from the white filter W may be used. For example, when the white filter W is made of an organic film having the refractive index of 1.6, silicon oxide ($SiO_2$: refractive index 1.45) is used as the mixed color prevention layer 31.

The formation of the mixed color prevention layer 31 may be isotropically performed by a CVD method and the like at a low temperature capable of being formed at a less than heat-resistance temperature of the previously formed white filter W. Accordingly, while the pattern shape of the white filter W is maintained, the mixed color prevention layer 31 is formed with a thin film on the side wall of the white filter W.

Figure 7D:
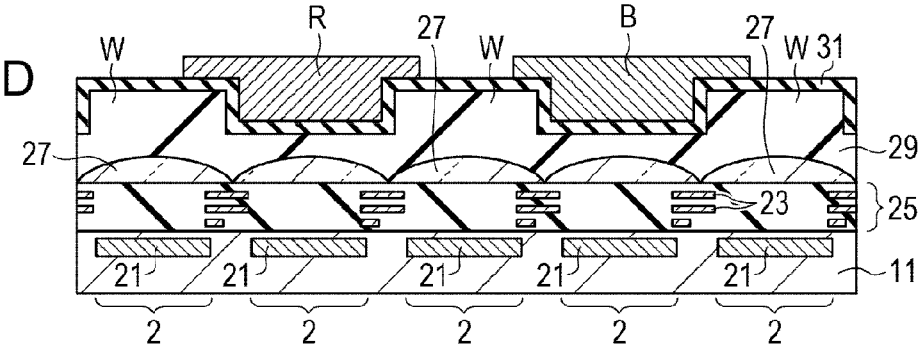

Next, as shown FIG. 7D, a red filter R, a blue filter B, and a green filter G (not shown) are formed on the mixed color prevention layer 31 in sequence, while being embedded between the white filter W. Referring to FIG. 2, each of the color filters R, B, and G is aligned in a checkered shape on the target pixel 2 as the second pattern having an independent island shape among the white filters W aligned in the checkered shape. In addition, the mixed color prevention layer 31 is closely disposed between each white filter W and the adjacent color filters R, B, and G.

In this case, the color filters R, B, and G are formed by using a photolithography process with a photoresist material containing each color pigment or each color dye as an optical filter material. In particular, each of the color filters R, B, and G uses a material having a refractive index higher than the mixed color prevention layer 31. For example, when the mixed color prevention layer 31 is made of silicon oxide ($SiO_2$: refractive index 1.45), each of the color filters R, B, and G is made of a material having a refractive index of about 1.65.

As described above, the order of forming each of the color filters R, B, and G is not particularly limited and each of the color filters R, B, and G is formed in a proper order depending on characteristics of the optical filter material used to form the color filters R, B, and G.

Figure 8A:
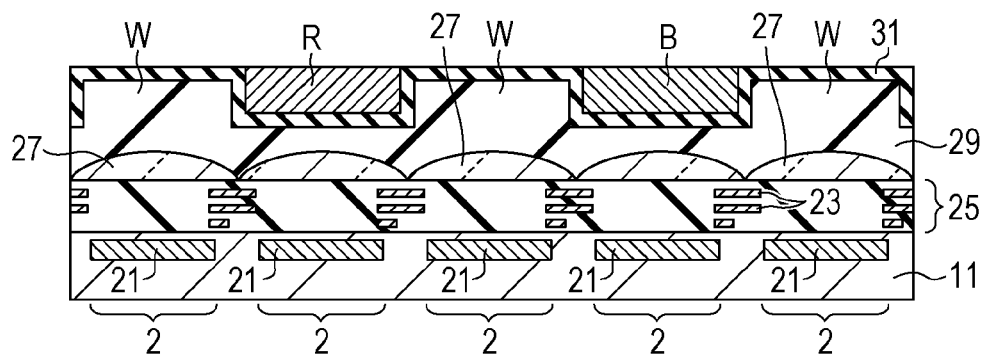
FIGS. 8A and 8B are cross section process diagrams (2) illustrating a manufacturing order of a second exemplary embodiment.

Next, as shown in FIG. 8A, due to an alignment difference in the formation of each of the color filters R, B, and G, a portion of each of the color filters R, B, and G overlapped with the white filter W is removed by a flattening process. In this case, the mixed color prevention layer 31 may be used to a stopper. In addition, when the alignment difference in the formation of each of the color filters R, B, and G is small and the portion of each of the color filters R, B, and G is not overlapped with the white filter W, the flattening process may not be performed. In addition, referring to FIG. 2, in viewing from the plan, four corners of each of the color filters R, B, and G may be joined to each other within the range of an alignment accuracy of the photolithography process in the formation of the white filter W.

Figure 8B:
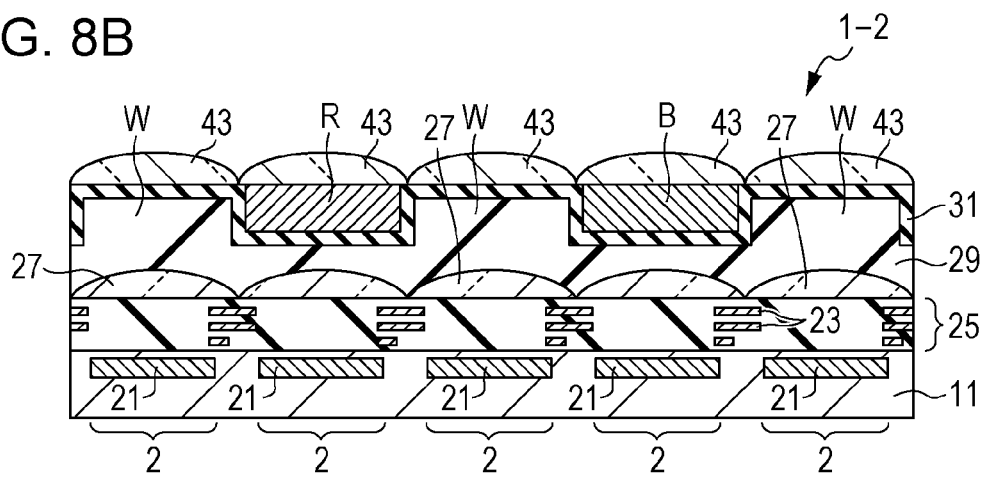

Thereafter, as shown in FIG. 8B, an on-chip lens 43 is formed on the color filters R, B, and G and the white filter W. The forming method of the on-chip lens 43 is not particularly limited. For example, a pattern made of a material having reflowability is formed on the color filters R, B, and G and the white filter W and the pattern is reflowed by heating to acquire the on-chip lens 43 formed in a lens shape.

As described above, the solid-state imaging device 1-2 of the second exemplary embodiment may be acquired. In the formed solid-state imaging device 1-2, the white filter W is aligned in a checkered shape as the first pattern having the independent island shape on the photoelectric conversion unit 21 of the surface of the substrate 11. Further, among the white filters W, each of the color filters R, B, and G is disposed as the second pattern having the independent island shape. In addition, between the white filter W and each of the color filters R, B, and G, the mixed color prevention layer 31 made of a material having a refractive index lower than the filters is closely disposed.

Therefore, even in the solid-state imaging device 1-2 of the second exemplary embodiment, as described by the first exemplary embodiment, the mixed color can be prevented and the image quality can be improved. Further, since the mixed color prevention layer 31 is left at an overall surface, the process of anisotropically etching the mixed color prevention layer 31 (the process of FIG. 4D) may be omitted, as compared with the first exemplary embodiment.

In particular, in the manufacturing method of the second exemplary embodiment, first, the mixed color prevention layer 31 is self-alignedly formed at the side wall of the white filter W formed as the first pattern having an island shape. Thereafter, each of the color filters R, B, and G is formed as the second pattern with the mixed color prevention layer 31 disposed closely between the white filters W. As a result, as shown in the first embodiment, when the mixed color prevention layer 31 is formed, a margin of the alignment with the patterned color filters W, R, B, and G is not necessary to be considered and a thickness of the mixed color prevention layer 31 disposed at the side wall of the color filters R, B, and G may be set by a minimum thickness. Accordingly, even in the manufacturing method of the second exemplary embodiment, the solid-state imaging device can be acquired, in which the mixed color prevention layer is installed so as to improve the image quality and an appropriable area of the color filters W, R, B, and G is maximally enlarged so as to further improve the image quality.

In addition, in the second exemplary embodiment, the configuration in which the mixed color prevention layer 31 is left at the overall surface was described. However, after the mixed color prevention layer 31 is formed by the process described in FIG. 7C, before the process described in FIG. 7D, while the mixed color prevention layer 31 is left on only the side wall of the white filter W, the mixed color prevention layer 31 may be removed by the etching. As a result, the solid-state imaging device of the same configuration as the first exemplary embodiment may be acquired.

4. Third Exemplary Embodiment

Method of Manufacturing a Solid-State Imaging Device Having a W Checkered Alignment (3)

The manufacturing method of the third exemplary embodiment is a third example of the method of manufacturing a solid-state imaging device in which an optical filter has a W checkered alignment as described in FIG. 2 like the first exemplary embodiment and the second exemplary embodiment and hereinafter, the manufacturing method will be described in sequence from a substrate.

First, as described by using FIG. 3 with respect to the first exemplary embodiment, a photoelectric conversion unit 21, a wire layer 25 including a wire 23, an in-layer lens 27, and a flat insulation film 29 are formed on the surface of a substrate 11 in sequence.

Figure 9A:
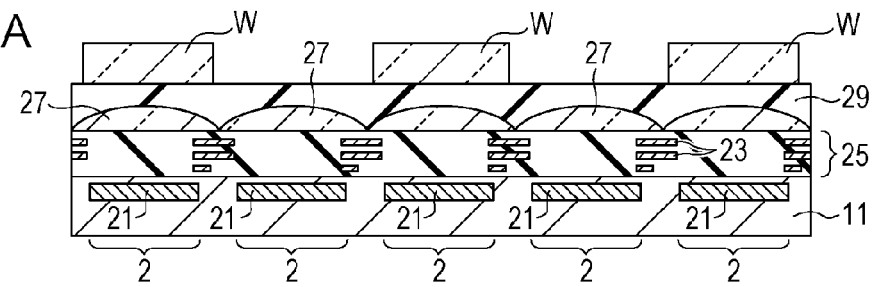
FIGS. 9A to 9E are cross section process diagrams illustrating a manufacturing order of a third exemplary embodiment.

Next, as shown FIG. 9A, on the flat insulation film 29, the white filter W having an independent island shape is patterned on the pixel 2 aligned in a checkered shape so as to widely cover the upper portion of the pixel 2. The white filter W is formed in a checkered alignment on a target pixel 2 as the first pattern. The white filter W is formed by a photolithography process by using the photoresist material as the optical filter material. However, referring to FIG. 2, in viewing from the plan, four corners of the white filter W may be joined to each other within the range of an alignment accuracy of the photolithography process in the formation of white filter W.

Figure 9B:
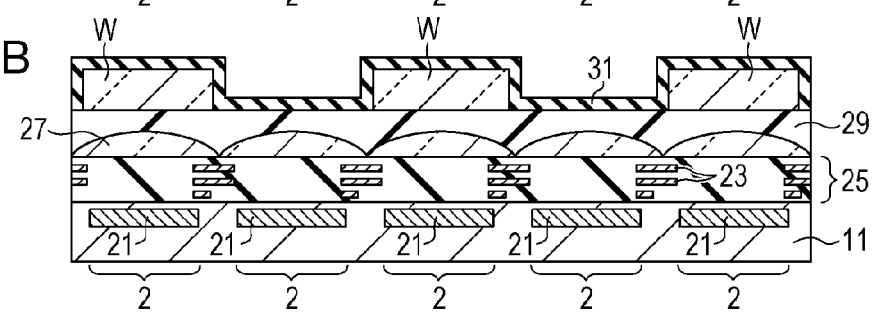
Figure 9C:
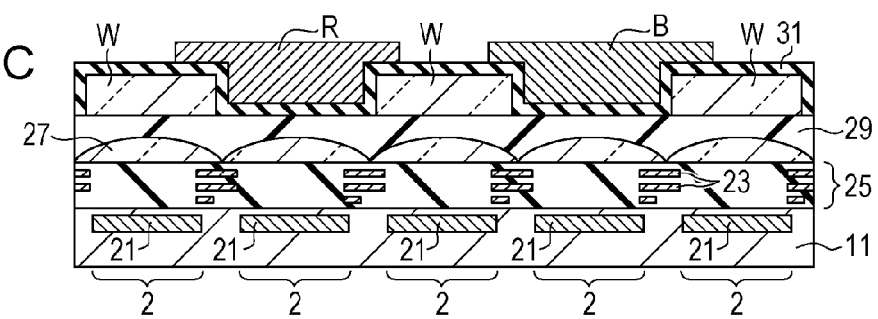
Figure 9D:
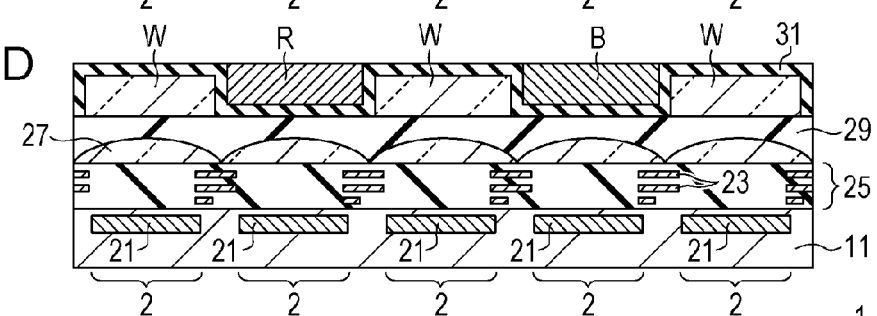

Processes illustrated in the following FIGS. 9B to 9D are performed as described in FIGS. 7C to 8B with respect to the second exemplary embodiment.

That is, as shown in FIG. 9B, the mixed color prevention layer 31 having a thickness thinner than the first pattern is formed on the flat insulation film 29 where the white filter W is formed as the first pattern with the white filter covered. Herein, the formed mixed color prevention layer 31 is made of a material having a refractive index lower than the white filter W. If the material of the mixed color prevention layer 31 has a refractive index lower than the white filter W, an inorganic insulation material such as silicon oxide, silicon nitride, silicon oxynitride, silicon carboxide, and the like is used. In addition, an organic insulation material or a conductive material may be used and all materials having high reflectance with respect to a light irradiation the white filter W may be used. For example, when the white filter W is made of an organic film having the refractive index of 1.6, silicon oxide ($SiO_2$: refractive index 1.45) is used as the mixed color prevention layer 31.

The formation of the mixed color prevention layer 31 may be isotropically performed by a CVD method and the like at a low temperature capable of being formed at a less than heat-resistance temperature of the previously formed white filter W. Accordingly, while the pattern shape of the white filter W is maintained, the mixed color prevention layer 31 is formed with a thin film on the side wall of the white filter W.

Next, as shown FIG. 9C, a red filter R, a blue filter B, and a green filter G (not shown) are formed on the mixed color prevention layer 31 in sequence, while being embedded between the white filter W. Referring to FIG. 2, each of the color filters R, B, and G is aligned in a checkered shape on the target pixel 2 as the second pattern having an independent island shape among the white filters W aligned in the checkered shape. In addition, the mixed color prevention layer 31 is closely disposed between each white filter W and the adjacent color filters R, B, and G.

In this case, the color filters R, B, and G are formed by using a photolithography process with a photoresist material containing each color pigment or each color dye as an optical filter material. In particular, each of the color filters R, B, and G uses a material having a refractive index higher than the mixed color prevention layer 31. For example, when the mixed color prevention layer 31 is made of silicon oxide ($SiO_2$: refractive index 1.45), each of the color filters R, B, and G is made of a material having a refractive index of about 1.65.

As described above, the order of forming each of the color filters R, B, and G is not particularly limited and each of the color filters R, B, and G is formed in a proper order depending on characteristics of the optical filter material used to form the color filters R, B, and G.

Next, as shown in FIG. 9D, due to an alignment difference in the formation of each of the color filters R, B, and G, a portion of each of the color filters R, B, and G overlapped with the white filter W is removed by a flattening process. In this case, the mixed color prevention layer 31 may be used to a stopper. In addition, when the alignment difference in the formation of each of the color filters R, B, and G is small and the portion of each of the color filters R, B, and G is not overlapped with the white filter W, the flattening process may not be performed. In addition, referring to FIG. 2, in viewing from the plan, four corners of each of the color filters R, B, and G may be joined to each other within the range of an alignment accuracy of the photolithography process in the formation of the white filter W.

Figure 9E:
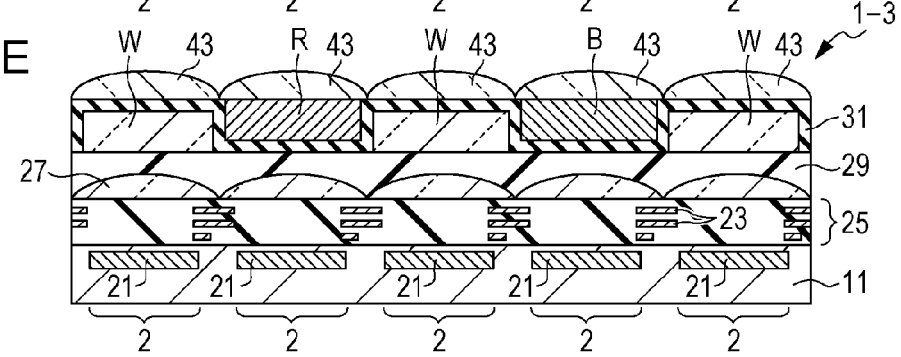

Thereafter, as shown in FIG. 9E, an on-chip lens 43 is formed on the color filters R, B, and G and the white filter W. The forming method of the on-chip lens 43 is not particularly limited. For example, a pattern made of a material having reflowability is formed on the color filters R, B, and G and the white filter W and the pattern is reflowed by heating to acquire the on-chip lens 43 formed in a lens shape.

As described above, the solid-state imaging device 1-3 of the third exemplary embodiment may be acquired. Like the second exemplary embodiment, in the acquired solid-state imaging device 1-3, the white filter W is aligned in a checkered shape as the first pattern having the independent island shape on the photoelectric conversion unit 21 of the surface of the substrate 11. Further, among the white filters W, each of the color filters R, B, and G is disposed as the second pattern having the independent island shape. In addition, between the white filter W and each of the color filters R, B, and G, the mixed color prevention layer 31 made of a material having a refractive index lower than the filters is closely disposed.

Therefore, even in the solid-state imaging device 1-3 of the third exemplary embodiment, as described by the first exemplary embodiment, the mixed color can be prevented and the image quality can be improved. Further, since the mixed color prevention layer 31 is left at an overall surface, the process of anisotropically etching the mixed color prevention layer 31 (the process of FIG. 4D) may be omitted, as compared with the first exemplary embodiment.

In particular, in the manufacturing method of the third exemplary embodiment, first, the mixed color prevention layer 31 is self-alignedly formed at the side wall of the white filter W formed as the first pattern having an island shape. Thereafter, each of the color filters R, B, and G is formed as the second pattern with the mixed color prevention layer 31 disposed closely between the white filters W. As a result, like the first embodiment, when the mixed color prevention layer 31 is formed, a margin of the alignment with the patterned color filters W, R, B, and G is not necessary to be considered and a thickness d of the mixed color prevention layer 31 disposed at the side wall of the color filters R, B, and G may be set by a minimum thickness. Accordingly, even in the manufacturing method of the third exemplary embodiment, the solid-state imaging device can be acquired, in which the mixed color prevention layer is installed so as to improve the image quality and an appropriable area of the color filters W, R, B, and G is maximally enlarged so as to further improve the image quality.

In addition, in the third exemplary embodiment, the configuration in which the mixed color prevention layer 31 is left at the overall surface was described. However, after the mixed color prevention layer 31 is formed by the process described in FIG. 9B, before the process described in FIG. 9C, while the mixed color prevention layer 31 is left on only the side wall of the white filter W, the mixed color prevention layer 31 may be removed by the etching like the second exemplary embodiment. As a result, the solid-state imaging device of the same configuration as the first exemplary embodiment may be acquired.

5. Fourth Exemplary Embodiment

Method of Manufacturing a Solid-State Imaging Device Having a W Checkered Alignment (4)

The manufacturing method of the fourth exemplary embodiment is a fourth example of the method of manufacturing a solid-state imaging device in which an optical filter has a W checkered alignment as described in FIG. 2 like the first exemplary embodiment and the second exemplary embodiment and hereinafter, the manufacturing method will be described in sequence from a substrate.

First, as described by using FIG. 3 with respect to the first exemplary embodiment, a photoelectric conversion unit 21, a wire layer 25 including a wire 23, an in-layer lens 27, and a flat insulation film 29 are formed on the surface of a substrate 11 in sequence.

Figure 10A:
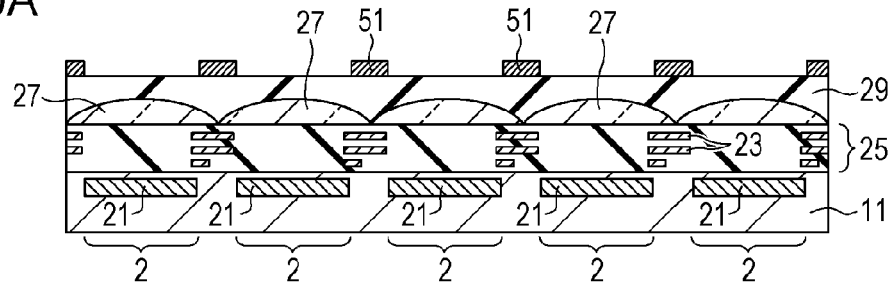
FIGS. 10A to 10D are cross section process diagrams (1) illustrating a manufacturing order of a fourth exemplary embodiment.

Next, as shown in FIG. 10A, on the flat insulation film 29, a reflective film 51 is patterned at a surroundings of the photoelectric conversion unit 21 in a position corresponding to an edge of each pixel 2. The reflective film 51 may be made of a material having high reflectivity such as aluminum and the like.

Figure 10B:
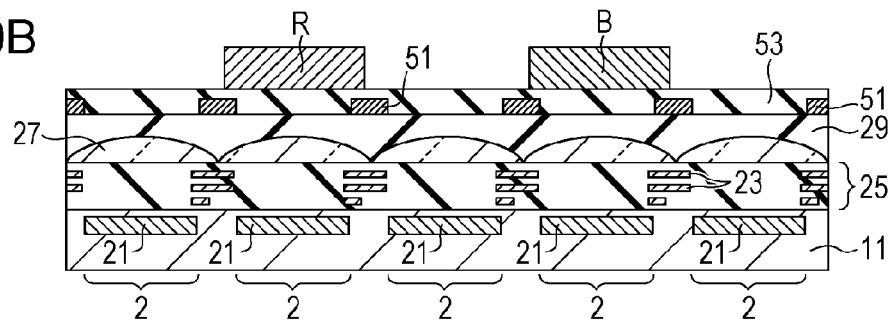

Next, as shown in FIG. 10B, an insulation film 53 further covers the flat insulation film 29 with the reflective film 51 if necessary. The insulation film 53 is formed to be flat if necessary.

Thereafter, a red filter R, a blue filter B, and a green filter G (not shown) having an independent island shape, respectively, are formed on the insulation film 53 in sequence with a checkered alignment as the first pattern on the target pixel 2. In this case, each of the color filters R, B, and G is patterned so that the edges of the color filters R, B, and G are disposed on the reflective film 51. The color filters R, B, and G are formed by a photolithography process by using the photoresist material including each color pigment or each color dye as the optical filter material. However, referring to FIG. 2, in viewing from the plan, four corners of the green filter G and four corners of the red filter R and the blue filter B my be joined to each other within the range of an alignment accuracy of the photolithography process in the formation of each of the color filters R, B, and G.

As described above, the order of forming each of the color filters R, B, and G is not particularly limited and each of the color filters R, B, and G is formed in a proper order depending on characteristics of the optical filter material used to form the color filters R, B, and G.

Figure 10C:
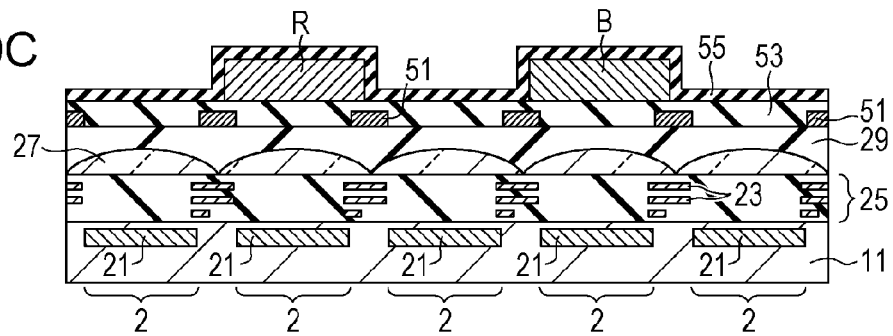

Next, as shown in FIG. 10C, a mixed color prevention layer 55 having a thickness thinner than the first pattern is formed on the flat insulation film 53 where each of the color filters R, B, and G (the green filter G is not shown) is formed as the first pattern with the color filters covered. Herein, the formed mixed color prevention layer 55 is made of a material having a refractive index higher than each of the color filters R, B, and G. If the material of the mixed color prevention layer 55 has a refractive index higher than each of the color filters R, B, and G, an inorganic insulation material such as silicon oxide, silicon nitride, silicon oxynitride, silicon carboxide, and the like is used. In addition, an organic insulation material or the like may be used and all materials taken in a light irradiation from each of the color filters R, B, and G may be used. For example, when the refractive index of each of the color filters R, B, and G is about 1.65, silicon nitride (refractive index 2.0) is used as the mixed color prevention layer 55.

The formation of the mixed color prevention layer 55 may be isotropically performed by a CVD method and the like at a low temperature capable of being formed at a less than heat-resistance temperature of the previously formed color filters R, B, and G. Accordingly, while the pattern shape of each of the color filters R, B, and G is maintained, the mixed color prevention layer 55 is formed with a thin film on the side wall of each of the color filters R, B, and G.

Figure 10D:
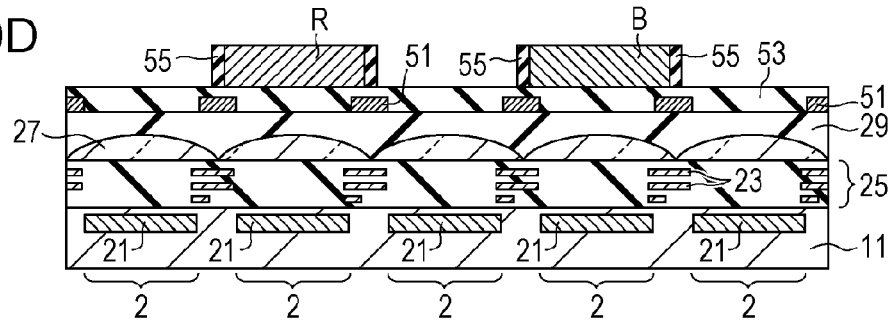

Next, as shown in FIG. 10D, the mixed color prevention layer 55 is left at only the side wall of each of the color filters R, B, and G by anisotropically etching the mixed color prevention layer 55 and the mixed color prevention layer 55 on each of the color filters R, B, and G and the insulation film 53 is removed. Accordingly, the mixed color prevention layer 55 is disposed above the reflective film 51.

Figure 11A:
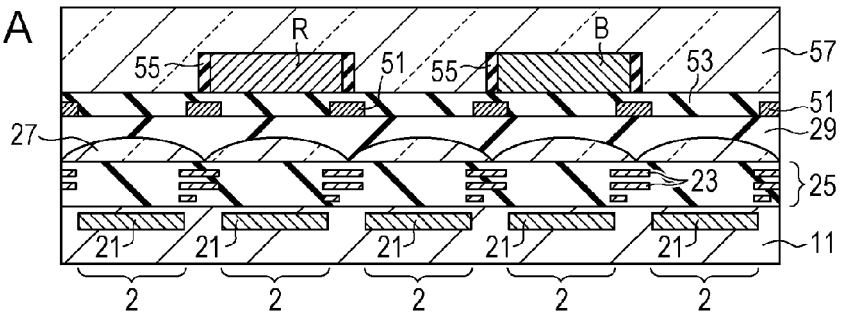
FIGS. 11A to 11D are cross section process diagrams (2) illustrating a manufacturing order of a fourth exemplary embodiment.

Thereafter, as shown in FIG. 11A, on the insulation film 53, a lens member 57 is film-formed with a sufficient thickness so as to embed the mixed color prevention layer 55 of each of the color filters R, B, and G and the side wall. The lens member 57 is made of a colorless transparent material transmitting the light from the red area to the blue area and is film-formed by, for example, an application. In particular, as described below, since the white filter W is configured to use the lens member 57, a material having a refractive index lower than the mixed color prevention layer 55 is used as the lens member 57. For example, when the mixed color prevention layer 55 is formed by silicon nitride (refractive index 2.0), an organic material having a refractive index of 1.6 is used as the lens member 57.

Figure 11B:
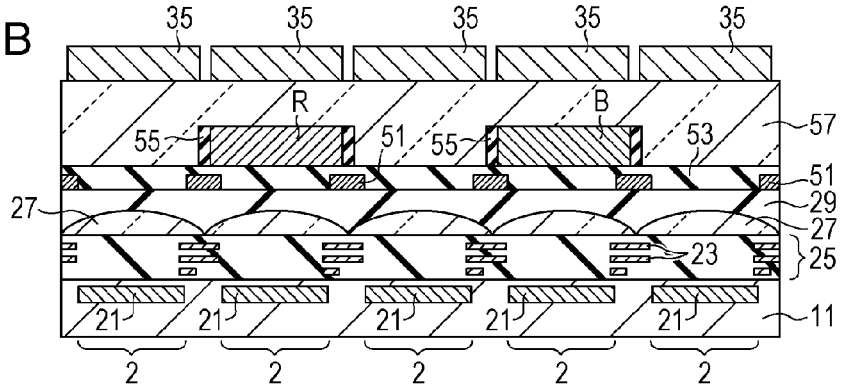
Figure 11C:
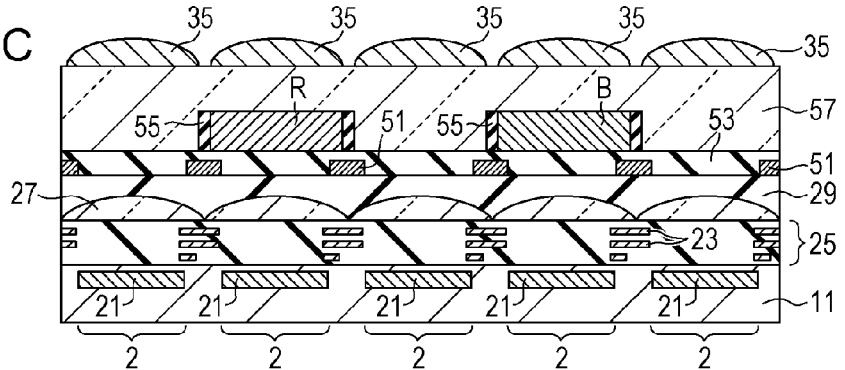
Figure 11D:
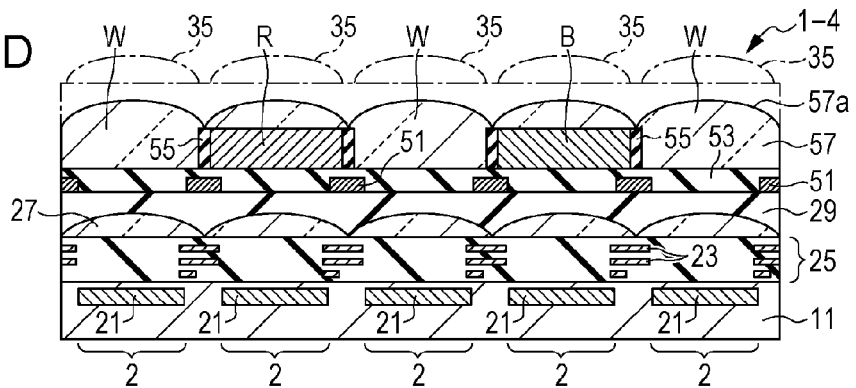

Processes illustrated in the following FIGS. 11B to 11D are performed as described in FIGS. 5B to 5D with respect to the first exemplary embodiment.

That is, first, as shown in FIG. 11B, a mask 35 made of a material having reflowability is patterned above the lens member 57 corresponding to all the pixels 2.

Thereafter, as shown in FIG. 11C, the mask 35 is reflowed by the heating to be formed in a lens shape.

Next, as shown in FIG. 11D, on the mask 35 reflowed in the lens shape, surface layers of the mask 35 and the lens member 57 are etched and the lens shape of the reflowed mask 35 is transferred on the surface of the lens member 57. Accordingly, an on-chip lens 57a is formed by forming the lens member above the color filters R, B, and G. In addition, among the color filters R, B, and G, the white filter W where the lens member 57 is left by the thicknesses of the color filters R, B, and G and the on-chip lens 57a made of the lens member thereabove are integrally formed.

The white filter W is aligned in a checkered shape on the target pixel 2 as the second pattern having an independent island shape among the color filters R, B, and G aligned in the checkered shape. In addition, the mixed color prevention layer 55 having a high refractive index is closely disposed between each white filter W and the adjacent color filters R, B, and G. However, referring to FIG. 2, in viewing from the plan, four corners of each white filter W may be joined to each other within the range of an alignment accuracy of the photolithography process in the formation of each of the color filters R, B, and G.

As described above, the solid-state imaging device 1-4 of the fourth exemplary embodiment may be formed. In the formed solid-state imaging device 1-4, the color filters R, B, and G are aligned in a checkered shape as the first pattern having the independent island shape on the photoelectric conversion unit 21 of the surface of the substrate 11, like the first exemplary embodiment. Further, among the color filters R, B, and G, the white filter W is disposed as the second pattern having the independent island shape. In addition, between the white filter W and each of the color filters R, B, and G, the mixed color prevention layer 55 made of a material having a refractive index higher than the filters is closely disposed.

Figure 12:
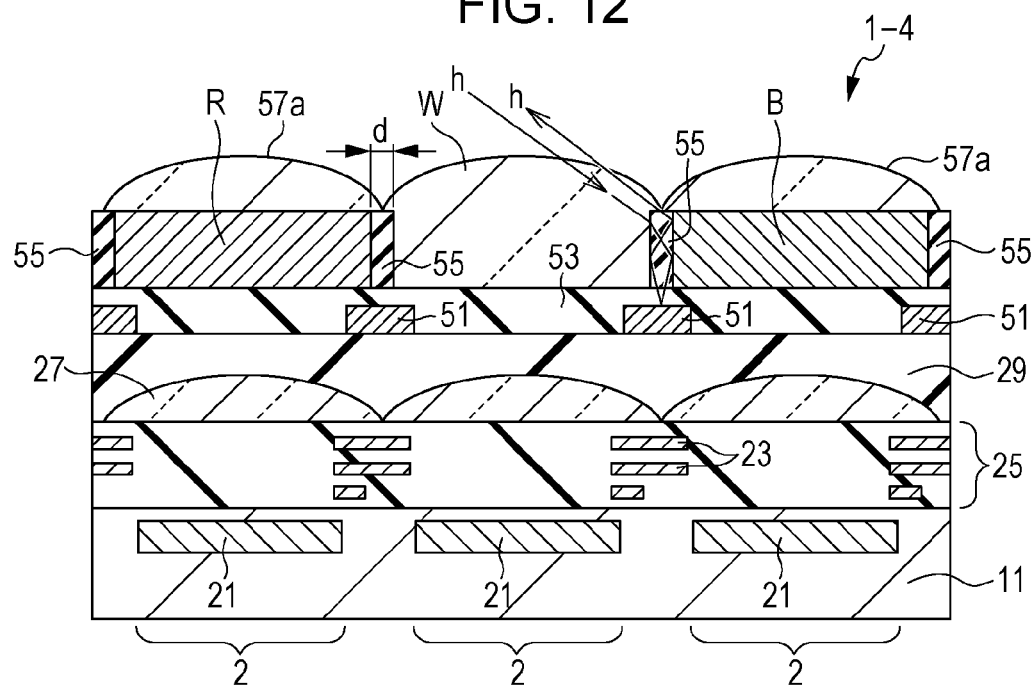
FIG. 12 is a cross-sectional view of a solid-state imaging device manufactured by the manufacturing order of the fourth exemplary embodiment.

FIG. 12 shows a cross-sectional configuration diagram enlarging main parts of the solid-state imaging device 1-4 formed by the fourth exemplary embodiment. As shown in FIG. 12, light h input to the solid-state imaging device 1-4 is concentrated by the on-chip lens 57a to be input to each of the color filters W, R, B, and G disposed below the on-chip lens 57a. Among the lights, an incident angle of the light h concentrated by the on-chip lens 57a and input to the color filters W, R, B, and G in an inclined direction is changed in a vertical direction to an interface of the mixed color prevention layer 55 having a high refractive index which is closely disposed between the color filters W, R, B, and G, as compared with the surface of the substrate 11. in addition, the light input in the mixed color prevention layer 55 is reflected on the interface between the mixed color prevention layer 55 and the optical filters W, R, B, and G, multi-reflected in the mixed color prevention layer 55, and further reflected to the reflective film 51 to be output to the on-chip lens 57a. As such, for example, the light h input in the inclined direction of the white filter W is prevented from being input to the photoelectric conversion unit 21 below the adjacent blue color filter B. Accordingly, for example, with respect to the photoelectric conversion unit 21 below the blue filter B, the light input to the pixel of the white filter W is input in the inclined direction and as a result, a light receiving output of a wavelength area which gets out of the blue area is detected from the pixel of the blue filter B, such that a so-called "mixed color" can be prevented. Therefore, in the solid-state imaging device 1-4 having the configuration acquired by the fourth exemplary embodiment, the mixed color can be prevented and the image quality can be improved.

In particular, in the manufacturing method of the fourth exemplary embodiment, first, the mixed color prevention layer 55 is self-alignedly formed at the side wall of each of the color filters R, B, and G formed as the first pattern having an island shape. Thereafter, the white filter W is formed as the second pattern with the mixed color prevention layer 55 disposed closely between the color filters R, B, and G. As a result, when the mixed color prevention layer 55 is formed, a margin of the alignment with the patterned color filters W, R, B, and G is not considered and a thickness d of the mixed color prevention layer 55 disposed at the side wall of the color filters R, B, and G may be set by a minimum thickness. Accordingly, according to the manufacturing method of the fourth exemplary embodiment, the solid-state imaging device can be acquired, in which the mixed color prevention layer 55 is installed so as to improve the image quality and an appropriate area of the color filters W, R, B, and G is maximally enlarged so as to further improve the image quality.

In addition, the configuration of the fourth exemplary embodiment may be acquired by applying the method using the mixed color prevention layer having a low refractive index described above. In this case, in the process described in FIG. 9A for the third exemplary embodiment, the white filter W is formed on the flat insulation film 29 after patterning the reflective film 51. In addition, in the process described in FIG. 9B, instead of the mixed color prevention layer 31 having a low refractive index, the mixed color prevention layer 55 using a material having a refractive index higher than the color filter R, B, and G and the white filter W may be formed.

6. Fifth Exemplary Embodiment

Method of Manufacturing a Solid-State Imaging Device Having a Bayer Alignment (1)

Figure 13:
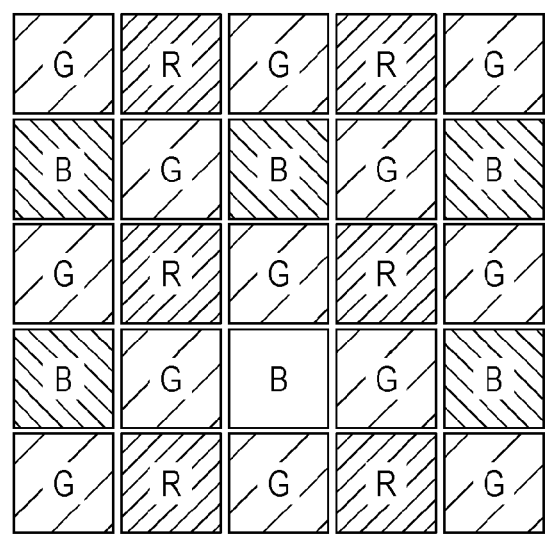
FIG. 13 is a plan view illustrating a bayer alignment of an optical filter according to fifth to sixth exemplary embodiments.

Before describing the manufacturing method of the fifth exemplary embodiment, in the solid-state imaging device having a bayer alignment manufactured by the manufacturing method of the fifth exemplary embodiment, an alignment of an optical filter will be described. FIG. 13 is a plan view illustrating an alignment state of a bayer alignment of an optical filter.

The solid-state imaging device having a bayer alignment manufactured by using the manufacturing method of the fifth to the sixth exemplary embodiment to be described below uses each of color filters G, R, and B as an optical filter on a photoelectric conversion unit. The color filters G, R, and B are an optical filter transmitting the light of a green area (referred to as a green filter G), an optical filter transmitting the light of a red area (referred to as a red filter R), and an optical filter transmitting the light of a blue area (referred to as a blue filter B).

Among the color filters, the green filter G is aligned in a checkered shape on each photoelectric conversion unit disposed in a row direction and in a column direction one by one among a plurality of photoelectric conversion units arranged on the surface of the substrate to be disposed as an independent island shape of pattern, respectively. Between the checkered aligned green filter G and the green filter G, the red filter R and the blue filter B are alternately disposed every other line. The red filter R and the blue filter B each is aligned in the checkered shape between the green filter G, as the independent island shape of pattern.

In the solid-state imaging device having the optical filter alignment, particularly, the manufacturing method of the fifth exemplary embodiment is a first example of manufacturing a configuration including a mixed color prevention layer (not shown) between the optical filters G, R, and B aligned in the bayer shape and hereinafter, the manufacturing method will be described in sequence from the substrate.

First, as described by using FIG. 3 with respect to the first exemplary embodiment, a photoelectric conversion unit 21, a wire layer 25 including a wire 23, an in-layer lens 27, and a flat insulation film 29 are formed on the surface of a substrate 11 in sequence.

Figure 14A:
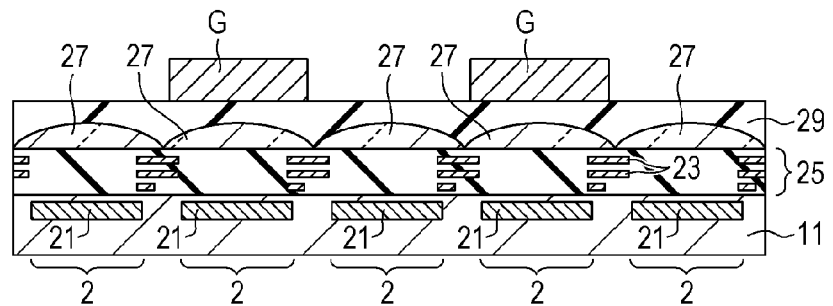
FIGS. 14A to 14D are cross section process diagrams (1) illustrating a manufacturing order of a fifth exemplary embodiment.

Next, as shown FIG. 14A, on the flat insulation film 29, the green filter G having an independent island shape is patterned on the pixel 2 aligned in the checkered shape so as to widely cover the upper portion of the pixel 2. The green filter G is formed on the target pixel 2 as the first pattern with a checkered alignment. In this case, the green filter G is formed by using a photolithography process with a photoresist material containing a green pigment or a green dye as the optical filter material. However, referring to FIG. 13, in viewing from the plan, four corners of the green filter G may be joined to each other within the range of an alignment accuracy of the photolithography process in the formation of the green filter G.

Figure 14B:
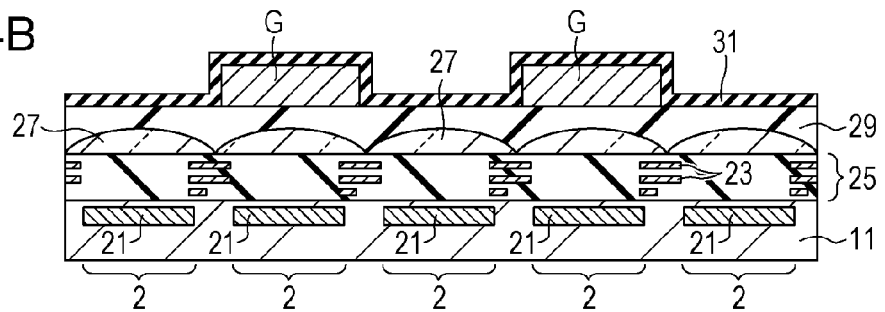

Next, as shown in FIG. 14B, a mixed color prevention layer 31 having a thickness thinner than the first pattern is formed on the flat insulation film 29 where the green filter G is formed as the first pattern with the green filter G covered. Herein, the formed mixed color prevention layer 31 is made of a material having a refractive index lower than the green filter G. If the material of the mixed color prevention layer 31 has a refractive index lower than the green filter G, an inorganic insulation material such as silicon oxide, silicon nitride, silicon oxynitride, silicon carboxide, and the like is used. In addition, an organic insulation material or a conductive material may be used and all materials having high reflectance with respect to a light irradiation the green filter G may be used. For example, when the green filter G has the refractive index of 1.65, silicon oxide ($SiO_2$: refractive index 1.45) is used as the mixed color prevention layer 31.

The formation of the mixed color prevention layer 31 may be isotropically performed by a CVD method and the like at a low temperature capable of being formed at a less than heat-resistance temperature of the previously formed green filter G. Accordingly, while the pattern shape of the green filter G is maintained, the mixed color prevention layer 31 is formed with a thin film on the side wall of the green filter G.

Figure 14C:
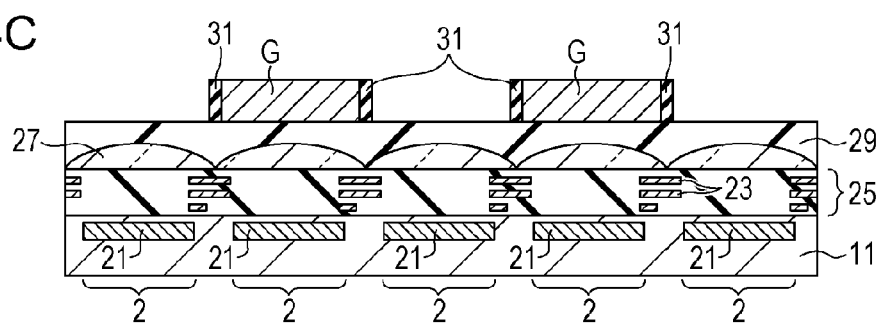

Next, as shown in FIG. 14C, the mixed color prevention layer 31 is left at only the side wall of the green filter G by anisotropically etching the mixed color prevention layer 31 and the mixed color prevention layer 31 on the green filter G and the flat insulation film 29 is removed.

Figure 14D:
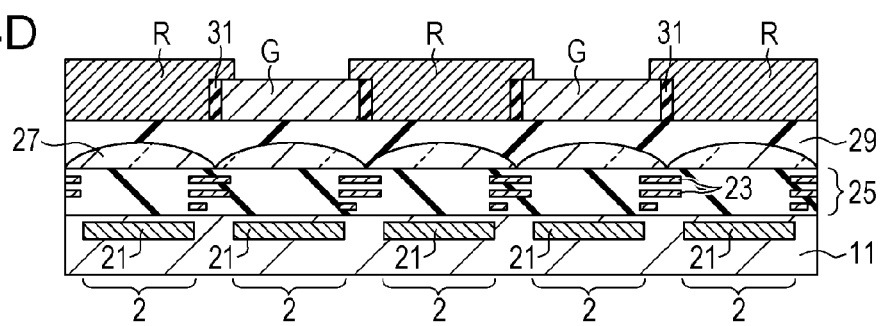

Next, as shown FIG. 14D, a red filter R and a blue filter B (not shown) are formed on the mixed color prevention layer 31 in sequence, while being embedded between the green filters G. Referring to FIG. 13, each of the color filters R and B is aligned in a checkered shape on the target pixel 2 as the second pattern having an independent island shape among the green filters G aligned in the checkered shape. In addition, the mixed color prevention layer 31 is closely disposed between each green filter G and the adjacent color filters R and B.

In this case, the color filters R and B are formed by using a photolithography process with a photoresist material containing each color pigment or each color dye as the optical filter material. In particular, each of the color filters R and B uses a material having a refractive index higher than the mixed color prevention layer 31. For example, when the mixed color prevention layer 31 is made of silicon oxide ($SiO_2$: refractive index 1.45), the red filter R and the blue filter B are made of an organic material having a refractive index of about 1.65.

As described above, the order of forming each of the color filters R and B is not particularly limited and each of the color filters R and B is formed in a proper order depending on characteristics of the optical filter material used to each of the color filters R and B.

Figure 15A:
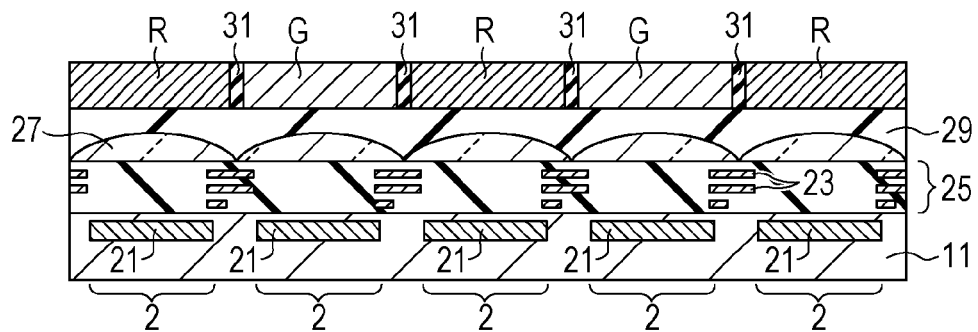
FIGS. 15A and 15B are cross section process diagrams (2) illustrating a manufacturing order of a fifth exemplary embodiment.

Next, as shown in FIG. 15A, due to an alignment difference in the formation of each of the color filters R and B, a portion of each of the color filters R and B overlapped with the green filter G is removed by a flattening process. In addition, when the alignment difference in the formation of each of the color filters R and B is small and the portion of each of the color filters R and B is not overlapped with the green filter G, the flattening process may not be performed. However, referring to FIG. 13, in viewing from the plan, four corners of the color filters R and B may be joined to each other within the range of an alignment accuracy of the photolithography process in the formation of the green filter G.

Figure 15B:
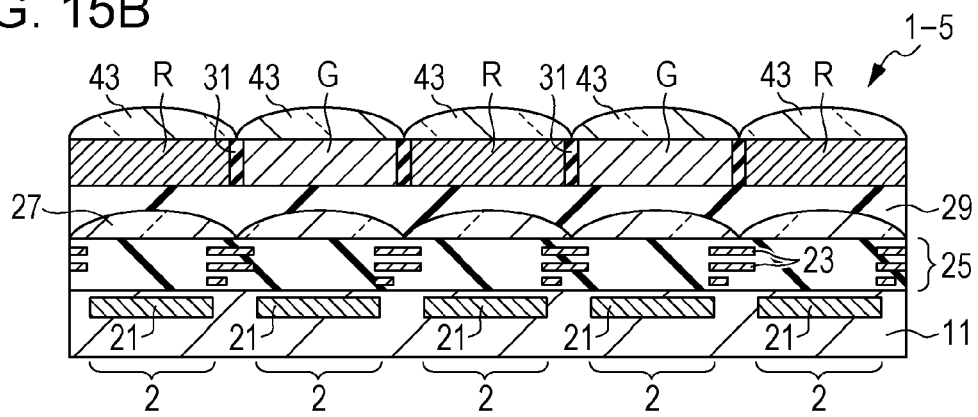

Next, as shown in FIG. 15B, an on-chip lens 43 is formed on each of the color filters G, R, and B. A method of forming the on-chip lens 43 is not particularly limited. For example, by forming a pattern made of a reflowable material on the color filters G, R, and B, the pattern is ref lowed by a heating to acquire the on-chip lens 43 formed in a lens shape.

As described above, the solid-state imaging device 1-5 of the fifth exemplary embodiment may be formed. In the formed solid-state imaging device 1-5, the green filter G is aligned in a checkered shape as the first pattern having the independent island shape on the photoelectric conversion unit 21 of the surface of the substrate 11. Further, among the green filters G, the red filter R and the blue filter B are disposed as the second pattern having the independent island shape. In addition, among the green filter G, the red filter R, and the blue filter B, the mixed color prevention layer 31 made of a material having a refractive index lower than the filters is closely disposed.

In the solid-state imaging device 1-5 configured as described above, the mixed color can be prevented like the solid-state imaging device of the first to the third exemplary embodiments. That is, the light h input in an inclined direction with respect to a target color filter (for example, the green filter G) is reflected to the mixed color prevention layer 31 disposed closely among the color filters G, R, and B such that the light h is not input to the photoelectric conversion unit 21 below the red filter R or the blue filter B. Accordingly, for example, with respect to the photoelectric conversion unit 21 below the blue filter B, the light input to the pixel of the green filter G is input in the inclined direction and as a result, a light receiving output of a wavelength area which gets out of the blue area is detected from the pixel of the blue filter B, such that a so-called "mixed color" can be prevented. Therefore, in the solid-state imaging device 1-5 having the configuration acquired by the fifth exemplary embodiment, the mixed color can be prevented and the image quality can be improved.

In particular, in the manufacturing method of the fifth exemplary embodiment, first, the mixed color prevention layer 31 is self-alignedly formed at the side wall of the green filter G formed as the first pattern having an island shape. Thereafter, the color filters R and B are formed as the second pattern with the mixed color prevention layer 31 disposed closely between the green filter G and the color filters R and B. As a result, when the mixed color prevention layer 31 is formed, a margin of the alignment with the patterned color filters G, R, and B, is not considered and a thickness of the mixed color prevention layer 31 may be set by a minimum thickness. Accordingly, even in the manufacturing method of the fifth exemplary embodiment, like the other exemplary embodiments, the solid-state imaging device can be acquired, in which the mixed color prevention layer is installed so as to improve the image quality and an appropriable area of the color filters G, R, and B is maximally enlarged so as to further improve the image quality.

7. Sixth Exemplary Embodiment

Method of Manufacturing a Solid-State Imaging Device Having a Bayer Alignment (2)

The manufacturing method of the sixth exemplary embodiment is a second example of the method of manufacturing a solid-state imaging device in which an optical filter has a bayer alignment as described in FIG. 13 like the fifth exemplary embodiment and the method of removing a mixed color prevention layer on the optical filter. Hereinafter, the manufacturing method will be described from the substrate in sequence.

First, as described by using FIG. 3 with respect to the first exemplary embodiment, a photoelectric conversion unit 21, a wire layer 25 including a wire 23, an in-layer lens 27, and a flat insulation film 29 are formed on the surface of a substrate 11 in sequence.

Figure 16A:
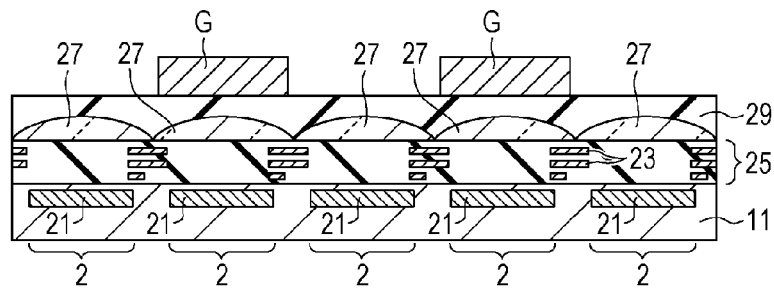
FIGS. 16A to 16E are cross section process diagrams illustrating a manufacturing order of a sixth exemplary embodiment.

Next, as shown FIG. 16A, on the flat insulation film 29, the green filter G having an independent island shape is patterned on the pixel 2 aligned in the checkered shape so as to widely cover the upper portion of the pixel 2, as described in FIG. 14A with respect to the fifth exemplary embodiment. The green filter G is formed on the target pixel 2 as the first pattern with a checkered alignment. In this case, the green filter G is formed by using a photolithography process with a photoresist material containing a green pigment or a green dye as the optical filter material. However, referring to FIG. 13, in viewing from the plan, four corners of the green filter G may be joined to each other within the range of an alignment accuracy of the photolithography process in the formation of the green filter G.

Figure 16B:
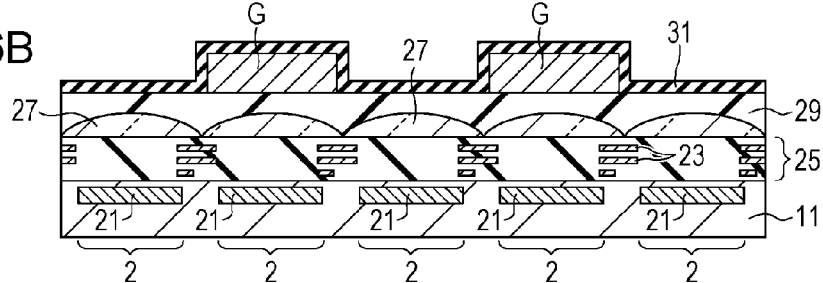

Next, as shown in FIG. 16B, a mixed color prevention layer 31 having a thickness thinner than the first pattern is formed on the flat insulation film 29 where the green filter G is formed as the first pattern with the green filter G covered. Herein, the formed mixed color prevention layer 31 is made of a material having a refractive index lower than the green filter G. If the material of the mixed color prevention layer 31 has a refractive index lower than the green filter G, an inorganic insulation material such as silicon oxide, silicon nitride, silicon oxynitride, silicon carboxide, and the like is used. In addition, an organic insulation material or a conductive material may be used and all materials having high reflectance with respect to a light irradiation the green filter G may be used. For example, when the green filter G has the refractive index of 1.65, silicon oxide ($SiO_2$: refractive index 1.45) is used as the mixed color prevention layer 31.

The formation of the mixed color prevention layer 31 may be isotropically performed by a CVD method and the like at a low temperature capable of being formed at a less than heat-resistance temperature of the previously formed green filter G. Accordingly, while the pattern shape of the green filter G is maintained, the mixed color prevention layer 31 is formed with a thin film on the side wall of the green filter G.

Figure 16C:
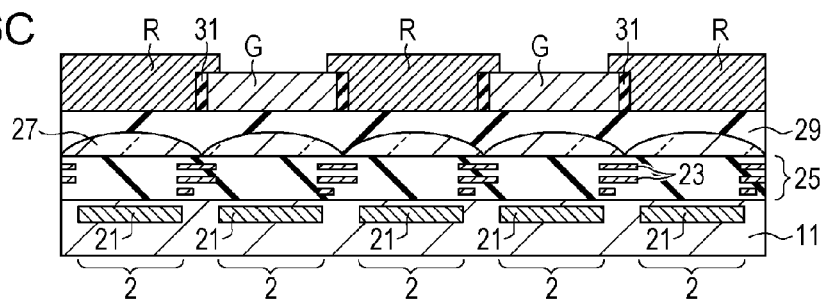

Next, as shown FIG. 16C, a red filter R and a blue filter B (not shown) are formed on the mixed color prevention layer 31 in sequence, while being embedded between the green filters G. Referring to FIG. 2, each of the color filters R and B is aligned in a checkered shape on the target pixel 2 as the second pattern having an independent island shape among the green filters G aligned in the checkered shape. In addition, the mixed color prevention layer 31 is closely disposed between each green filter G and the adjacent color filters R and B.

In this case, the color filters R and B are formed by using a photolithography process with a photoresist material containing each color pigment or each color dye as the optical filter material. In particular, each of the color filters R and B uses a material having a refractive index higher than the mixed color prevention layer 31. For example, when the mixed color prevention layer 31 is made of silicon oxide ($SiO_2$: refractive index 1.45), the red filter R and the blue filter B are made of an organic material having a refractive index of about 1.65.

As described above, the order of forming each of the color filters R and B is not particularly limited and each of the color filters R and B is formed in a proper order depending on characteristics of the optical filter material used to each of the color filters R and B.

Figure 16D:
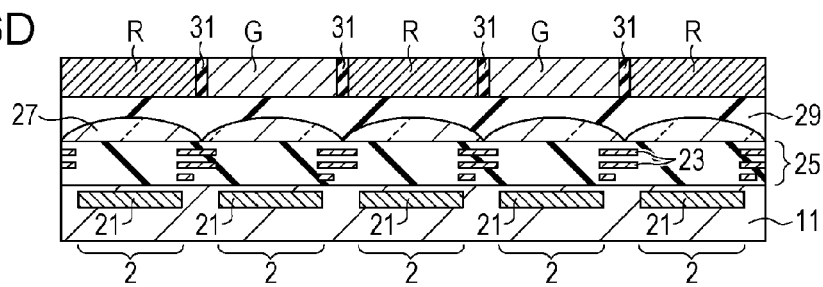

Next, as shown in FIG. 16D, due to an alignment difference in the formation of each of the color filters R and B, a portion of each of the color filters R and B overlapped with the green filter G is removed by a flattening process. In addition, when the alignment difference in the formation of each of the color filters R and B is small and the portion of each of the color filters R and B is not overlapped with the green filter G, the flattening process may not be performed. However, referring to FIG. 13, in viewing from the plan, four corners of the color filters R and B may be joined to each other within the range of an alignment accuracy of the photolithography process in the formation of the green filter G.

Figure 16E:
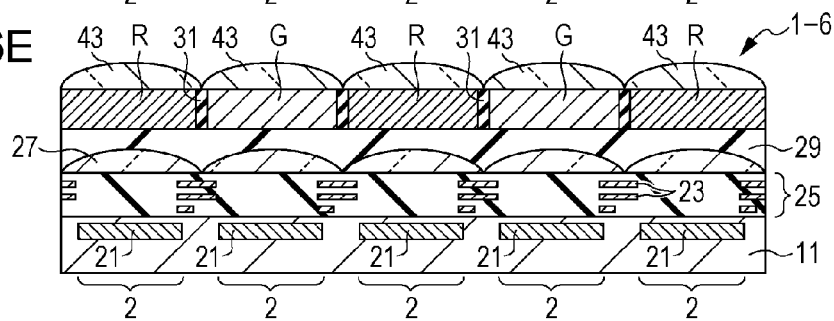

Next, as shown in FIG. 16E, an on-chip lens 43 is formed on each of the color filters R, B, and G. A method of forming the on-chip lens 43 is not particularly limited. For example, by forming a pattern made of a reflowable material on the color filters R, B, and G, the pattern is reflowed by the heating to acquire the on-chip lens 43 formed in a lens shape.

As described above, the solid-state imaging device 1-6 of the sixth exemplary embodiment may be formed. In the formed solid-state imaging device 1-6, the green filter G is aligned in a checkered shape as the first pattern having the independent island shape on the photoelectric conversion unit 21 of the surface of the substrate 11, like the solid-state imaging device 1-5 of the fifth exemplary embodiment. Further, among the green filters G, the red filter R and the blue filter B are disposed as the second pattern having the independent island shape. In addition, among the green filter G, the red filter R, and the blue filter B, the mixed color prevention layer 31 made of a material having a refractive index lower than the filters is closely disposed.

Therefore, in the solid-state imaging device 1-6 having the configuration acquired by the sixth exemplary embodiment, the mixed color can be prevented and the image quality can be improved, as described in the fifth exemplary embodiment. Further, since the mixed color prevention layer 31 is left at the overall surface, the process of anisotropically etching the mixed color prevention layer 31 may be omitted.

In particular, in the manufacturing method of the sixth exemplary embodiment, first, the mixed color prevention layer 31 is self-alignedly formed at the side wall of the green filter G formed as the first pattern having an island shape. Thereafter, the color filters R and B are formed as the second pattern with the mixed color prevention layer 31 disposed closely between the green filter G and the color filters R and B. As a result, like other exemplary embodiments, when the mixed color prevention layer 31 is formed, a margin of the alignment with the patterned color filters G, R, and B is not considered and a thickness of the mixed color prevention layer 31 may be set by a minimum thickness. Accordingly, even in the manufacturing method of the sixth exemplary embodiment, like other exemplary embodiments, the solid-state imaging device can be acquired, in which the mixed color prevention layer is installed so as to improve the image quality and an appropriable area of the color filters G, R, and B is maximally enlarged so as to further improve the image quality.

In addition, in the sixth exemplary embodiment, the configuration using the mixed color prevention layer having a high refractive index of the fourth exemplary embodiment may be combined. In this case, in the process described in FIG. 16A, the green filter G is formed thereabove after patterning the reflective film 51 on the flat insulation film 29. In addition, in the process described in FIG. 16B, instead of the mixed color prevention layer 31 having a low refractive index, a mixed color prevention layer 55 using a material having a refractive index higher than the color filter R, B, and G may be formed.

Further, in the exemplary embodiments described above, the alignment of the optical pattern for each color which is the W checkered alignment in the first to the fourth exemplary embodiments and the bayer alignment in the fifth to the sixth exemplary embodiments was described. However, in the present disclosure, the alignment of the optical pattern is not limited. That is, the present disclosure can be widely applied as the method of manufacturing the solid image pick apparatus, in which the optical filter layer is manufactured by forming the optical filter having the independent island shape as the first pattern and thereafter, forming the other optical filter between the first patterns as the second pattern, and can acquire like effect.

Further, in the exemplary embodiments of the present disclosure described above, the configuration applied to the MOS type solid-state imaging device was described. However, the present disclosure is not limited thereto and for example, may be applied to a CCD type solid-state imaging device.

Further, in the exemplary embodiments described above, the present disclosure was applied to the solid-state imaging device including the color filters for each color and the mixed color prevention layer in which the wire 23 such as the read electrode and the like is disposed on the surface of the substrate 11 with the photoelectric conversion unit 21 and the first pattern and the second pattern are formed thereon. However, the present disclosure may be applied to a so-called backside illuminated solid-state imaging device in which the wire 23 such as the read electrode and the like is disposed on the surface of the substrate 11 opposite to the photoelectric conversion unit 21. In the backside illuminated solid-state imaging device, the surface of the substrate 11 opposite to the surface with the wire 23 is a light receiving surface of the photoelectric conversion unit 21 and the color filters for each color and the mixed color prevention layer having the first pattern and the second pattern are disposed on the surface. Accordingly, the backside illuminated solid-state imaging device may be manufactured by forming the photoelectric conversion unit 21 on the substrate 11 and thereafter, forming the optical filter having the first pattern, forming the mixed color prevention layer, and forming the optical filter having the second pattern according to the order of each exemplary embodiment described above, independent of the formation of the wire 23 such as a read electrode and the like. Further, after forming the first pattern, the mixed color prevention layer, and the second pattern, the on-chip is formed thereabove. In addition, before forming the first pattern, the in-layer lens may be formed, if necessary.

8. Seventh Exemplary Embodiment

Configuration Example of an Electronic Apparatus

The solid-state imaging device manufactured by the manufacturing method related to the present disclosure described in the first to the sixth exemplary embodiments may be applied to an electronic apparatus such as, for example, a camera system, such as a digital camera or a video camera, a portable phone having a image pickup function, or other devices having a image pickup function.

Figure 17:
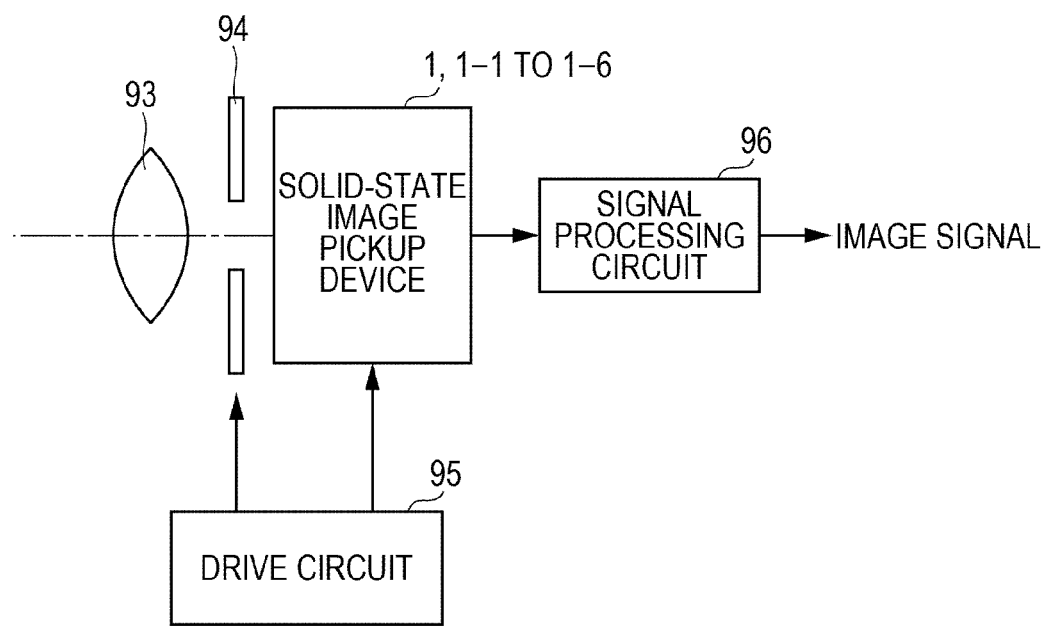
FIG. 17 is a configuration diagram of an electronic apparatus of a seventh exemplary embodiment.

FIG. 17 shows a seventh exemplary embodiment applied to a camera as an example of an electronic apparatus related to the present disclosure. The camera related to the exemplary embodiment exemplifies a video camera capable of picking-up a still image or a moving image. The camera 91 according to the exemplary embodiment includes a solid-state imaging device 1, an optical system 93 guiding an incident light to a light receiving sensor of the solid-state imaging device 1, a shutter device 94, a driving circuit 95 driving the solid-state imaging device 1, and a signal processing circuit 96 processing an output signal of the solid-state imaging device 1.

The solid-state imaging devices 1-1 to 1-6 manufactured by the manufacturing method of each exemplary embodiment described above are applied to the solid-state imaging device 1. The optical system (optical lens) 93 image-forms an image light (incident light) from an object on an imaging area of the solid-state imaging device 1. Accordingly, a signal charge of a predetermined period is accumulated in the solid-state imaging device 1. The optical system 93 may be an optical lens system configured by a plurality of optical lenses. The shutter device 94 controls a light irradiation period and a light shield period of the solid-state imaging device 1. The driving circuit 95 supplies a driving signal controlling a transmission operation of the solid-state imaging device 1 and a shutter operation of the shutter device 94. The signal of the solid-state imaging device 1 is transmitted by the driving signal (timing signal) supplied from the driving circuit 95. The signal processing circuit 96 performs various kinds of signal processes. The processed image signal is stored in a storing medium such as a memory or the like or output to a monitor.

Accordingly, according to the electronic apparatus of the seventh exemplary embodiment, the solid-state imaging device can be acquired, in which the mixed color prevention layer is installed so as to improve the image quality and an appropriable area of the color filters W, R, B, and G is maximally enlarged so as to further improve the image quality, such that the electronic apparatus having high image quality can be provided. For example, a camera improving image quality and the like may be provided.

The present disclosure contains subject matter related to that disclosed in Japanese Priority Patent Application JP 2010-217861 filed in the Japan Patent Office on Sep. 28, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, comprising:
    forming a plurality of first patterns each having an independent island shape configured from an optical filter material on some of photoelectric conversion units among a plurality of photoelectric conversion units arranged on a surface of a substrate;
    forming a mixed color prevention layer on a side wall of each first pattern;
    forming a plurality of second patterns each having an independent island shape configured from an optical filter material on the rest of the photoelectric conversion units among the plurality of photoelectric conversion units, the mixed color prevention layer being disposed between each first pattern and each second pattern, and
    forming a plurality of lenses respectively over the plurality of first and second patterns, wherein,
        each first pattern corresponds to one of a red color filter, a green color filter, and a blue color filter,
        each second pattern corresponds to a white filter, and
        the plurality of second patterns and the plurality of lenses are formed from a same material such that a second pattern and a corresponding lens thereabove are integrally formed.

2. The method of manufacturing a solid-state imaging device according to claim 1, wherein forming of the mixed color prevention layer is performed by isotropically forming the mixed color prevention layer having a thickness thinner than the first pattern with the first pattern covered.

3. The method of manufacturing a solid-state imaging device according to claim 2, wherein forming of the mixed color prevention layer is performed by covering the plurality of first patterns with the mixed color prevention layer and removing the mixed color prevention layer such that the mixed color prevention layer is left only on the side wall of each first pattern.

4. The method of manufacturing a solid-state imaging device according to claim 1, wherein each second pattern is disposed between one first pattern and another first pattern.

5. The method of manufacturing a solid-state imaging device according to claim 1, wherein the mixed color prevention layer has a refraction index that is lower than a refraction index of the first pattern and a refraction index of the second pattern.

6. The method of manufacturing a solid-state imaging device according to claim 1, wherein the plurality of first patterns and the plurality of second patterns are disposed in a checkered pattern.

7. The method of manufacturing a solid-state imaging device according to claim 1, wherein the same material is a colorless transparent material.

8. The method of manufacturing a solid-state imaging device according to claim 1, wherein the colorless transparent material transmits light from a red area to a blue area.

9. The method of manufacturing a solid-state imaging device according to claim 1, wherein the same material is an organic material.

* * * * *